United States Patent
Tokuhisa

(10) Patent No.: US 11,366,070 B2
(45) Date of Patent: Jun. 21, 2022

(54) PULSED LIGHT GENERATION DEVICE, PULSED LIGHT GENERATION METHOD, EXPOSURE APPARATUS HAVING PULSED LIGHT GENERATION DEVICE AND INSPECTION APPARATUS HAVING PULSED LIGHT GENERATION DEVICE

(71) Applicant: NIKON CORPORATION, Tokyo (JP)

(72) Inventor: Akira Tokuhisa, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 390 days.

(21) Appl. No.: 16/200,166

(22) Filed: Nov. 26, 2018

(65) Prior Publication Data

US 2019/0094686 A1 Mar. 28, 2019

Related U.S. Application Data

(63) Continuation of application No. PCT/JP2017/018853, filed on May 19, 2017.

(30) Foreign Application Priority Data

May 26, 2016 (JP) .............................. JP2016-105613

(51) Int. Cl.
*G03F 1/84* (2012.01)
*H01S 3/10* (2006.01)
(Continued)

(52) U.S. Cl.
CPC ............. *G01N 21/956* (2013.01); *G03F 1/84* (2013.01); *G03F 7/70041* (2013.01);
(Continued)

(58) Field of Classification Search
CPC .......... G03F 1/84; G03F 7/70041; G03F 7/20; G02F 1/211; G02F 2203/50; G02F 1/212;
(Continued)

(56) References Cited

U.S. PATENT DOCUMENTS

2007/0064749 A1* 3/2007 Kaneda ................. G02F 1/3532
372/21
2011/0032605 A1* 2/2011 Kliner ....................... H01S 3/11
359/344
(Continued)

FOREIGN PATENT DOCUMENTS

JP 7-58698 3/1995
JP 7-58699 3/1995
(Continued)

OTHER PUBLICATIONS

Japanese Office Action dated Jan. 7, 2020 in corresponding Japanese Patent Application No. 2018-519248.
(Continued)

*Primary Examiner* — Brandi N Thomas

(57) ABSTRACT

A pulsed light generation device includes: an optical coupler having four input/output ports including a first port, a second port, a third port and a fourth port; a connection optical path that connects the third port with the fourth port; and a phase modulation element disposed in the connection optical path. The optical coupler branches pulsed light input to the first port and outputs the branched input pulsed light as first-direction pulsed light and second-direction pulsed light to the third port and to the fourth port. The modulation element applies phase modulation to either one of the first-direction pulsed light and the second-direction pulsed light, thereby outputs output pulsed lights through the first port and the second port, wherein a waveform of one of the pulsed lights output through the first port is different from a waveform of the other of the output pulsed lights output through the second port.

31 Claims, 23 Drawing Sheets

(51) Int. Cl.
*G01N 21/956* (2006.01)
*G03F 7/20* (2006.01)
*H01S 3/00* (2006.01)
*G02F 1/21* (2006.01)
*H01S 5/00* (2006.01)

(52) U.S. Cl.
CPC ........ *H01S 3/0078* (2013.01); *H01S 3/10053* (2013.01); *G01N 2021/95676* (2013.01); *G02F 1/211* (2021.01); *H01S 3/0085* (2013.01); *H01S 5/005* (2013.01)

(58) Field of Classification Search
CPC .. G02F 1/225; G02F 2201/06; G02F 2201/14; G02F 2201/58; G02F 1/01; G02F 1/21; G02F 1/3515; G02F 1/3523; G02F 1/37; G02F 2001/211; G02F 7/00
See application file for complete search history.

(56) References Cited

U.S. PATENT DOCUMENTS

| | | | |
|---|---|---|---|
| 2013/0027945 A1* | 1/2013 | Harada | G02F 1/3558 362/293 |
| 2013/0230071 A1 | 9/2013 | Haensel et al. | |
| 2015/0303647 A1 | 10/2015 | Tokuhisa | |

FOREIGN PATENT DOCUMENTS

| | | |
|---|---|---|
| JP | 8-116307 | 5/1996 |
| JP | 8-125605 | 5/1996 |
| JP | 9-236781 | 9/1997 |
| JP | 2003-75787 | 3/2003 |
| JP | 2007-300496 | 11/2007 |
| JP | 2011-49296 | 3/2011 |
| JP | 2012-2965 | 1/2012 |
| JP | 2012-54500 | 3/2012 |
| JP | 5211487 | 6/2013 |
| JP | 2013-187542 | 9/2013 |
| JP | 2014-224917 | 12/2014 |
| JP | 5648969 | 1/2015 |
| JP | 2015-180902 | 10/2015 |
| WO | WO 02/095486 A1 | 11/2002 |
| WO | WO 2014/141973 A1 | 9/2014 |

OTHER PUBLICATIONS

Japanese Office Action dated Aug. 6, 2019 in corresponding Japanese Patent Application No. 2018-519248.
Taiwanese Office Action dated Dec. 18, 2020, in corresponding Taiwanese Patent Application No. 106117310.
Office Action dated Jun. 16, 2020, in corresponding Japanese Patent Application No. 2018-519248 (11 pages).
International Search Report dated Aug. 8, 2017 in corresponding International Application No. PCT/JP2017/018853.
Office Action dated Jun. 11, 2020, in corresponding Japanese Patent Application No. 2018-519248 (11 pages).
Office Action, dated Jun. 16, 2021, in Chinese Patent Application No. 201780032270.2 (16 pp.).
Office Action, dated Jun. 28, 2021, in Korean Patent Application No. 10-2018-7034136 (12 pp.).
Chinese Office Action dated Feb. 7, 2021, in corresponding Chinese Patent Application No. 201780032270.2.

* cited by examiner

AMPLITUDES OF PULSED LIGHT 11 AND PULSE FLIGHT 21,
AND MULTIPLEXED LIGHT INTENSITY (a) AMPLITUDE OF PULSED LIGHT 11

(b) AMPLITUDE OF PULSED LIGHT 21

(c) MULTIPLEXED LIGHT INTENSITY

AMPLITUDES OF PULSED LIGHT 12 AND PULSE FLIGHT 22, AND MULTIPLEXED LIGHT INTENSITY

(a) AMPLITUDE OF PULSED LIGHT 12

(b) AMPLITUDE OF PULSED LIGHT 22

(c) MULTIPLEXED LIGHT INTENSITY

AMPLITUDES OF PULSED LIGHT 11 AND PULSED LIGHT 21, AND MULTIPLEXED LIGHT INTENSITY

(a) AMPLITUDE OF PULSED LIGHT 11

UNMODULATED    MODULATED    UNMODULATED (b) AMPLITUDE OF PULSED LIGHT 21

UNMODULATED (C) MULTIPLEXED LIGHT INTENSITY

AMPLITUDES OF PULSED LIGHT 12 AND PULSED LIGHT 22, AND MULTIPLEXED LIGHT INTENSITY (a) AMPLITUDE OF PULSED LIGHT 12

UNMODULATED    MODULATED    UNMODULATED (b) AMPLITUDE OF PULSED LIGHT 22

UNMODULATED (C) MULTIPLEXED LIGHT INTENSITY

PULSED LIGHT GENERATION DEVICE, PULSED LIGHT GENERATION METHOD, EXPOSURE APPARATUS HAVING PULSED LIGHT GENERATION DEVICE AND INSPECTION APPARATUS HAVING PULSED LIGHT GENERATION DEVICE

CROSS REFERENCE TO RELATED APPLICATIONS

This application is a continuation of international application No. PCT/JP2017/018853 filed May 19, 2017 which claims the foreign priority benefit to Japanese Patent Application No. 2016-105613, filed May 26, 2016.

The disclosures of the following priority applications are herein incorporated by reference: International application No. PCT/JP2017/018853 filed May 19, 2017 and Japanese application No. 2016-105613, filed May 26, 2016.

BACKGROUND ART

1. Technical Field

The present invention relates to a pulsed light generation device, a pulsed light generation method, an exposure apparatus having the pulsed light generation device and an inspection apparatus having the pulsed light generation device.

2. Description of Related Art

When using pulsed light emitted from a laser such as a semiconductor laser as a light source for an inspection apparatus or a processing apparatus, it is required to emit pulsed light with high intensity and narrow wavelength spectrum width. In order to obtain pulsed light with high intensity, it is necessary to amplify pulsed light having been emitted from a semiconductor laser by an optical fiber amplifier. However, phase modulation occurs in the pulsed light through self-phase modulation while it is being amplified, resulting in a broadening of the pulsed light wavelength spectrum.

Japanese Laid Open Patent Publication No. 2013-187542 discloses a laser resonator equipped with a nonlinear optical loop mirror which includes a non-reciprocal optical element.

SUMMARY

The laser resonator disclosed in Japanese Laid Open Patent Publication No. 2013-187542 is not capable of generating two types of pulsed light with their waveforms different from each other.

According to the first aspect of the present invention, a pulsed light generation device, comprises: an optical coupler having at least four input/output ports including a first port, a second port, a third port and a fourth port; a connection optical path that connects the third port with the fourth port; and a phase modulation element disposed in the connection optical path, wherein: the optical coupler branches input pulsed light input to the first port and outputs the branched input pulsed light as first-direction pulsed light and second-direction pulsed light respectively toward the third port and toward the fourth port; and the phase modulation element applies phase modulation to at least either one of the first-direction pulsed light and the second-direction pulsed light, thereby outputs output pulsed lights through the first port and through the second port, wherein a waveform of the one of the output pulsed lights output through the first port is different from a waveform of the other of the output pulsed lights output through the second port.

According to the second aspect of the present invention, a pulsed light generation method, comprises steps of: inputting pulsed light for inputting to a first port of an optical coupler having at least four input/output ports including the first port, a second port, a third port and a fourth port, and branching the pulsed light for inputting; outputting first-direction pulsed light and second-direction pulsed light respectively through the third port and the fourth port, to a connection optical path to which the third port and the fourth port are connected; applying phase modulation to at least either one of the first-direction pulsed light and the second-direction pulsed light in the connection optical path; and outputting output pulsed lights through the first port and through the second port, wherein a waveform of the either of the output pulsed lights through the first port is different from a waveform of the other of the output pulsed lights output through the second port.

DESCRIPTION OF EMBODIMENTS

First Embodiment

Figure 1:
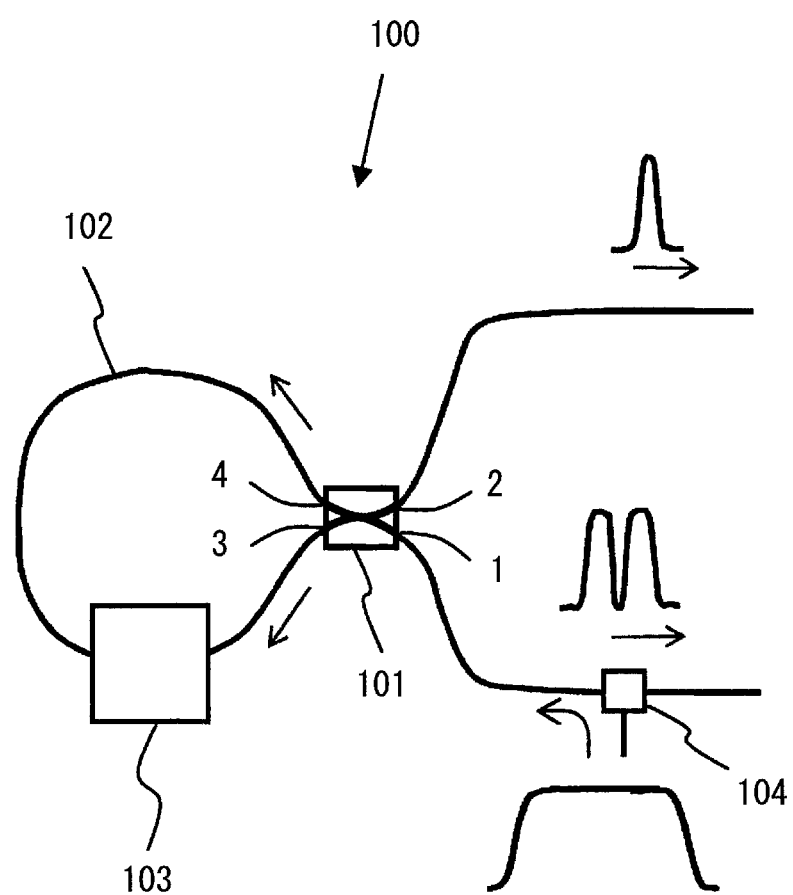
FIG. 1 is a conceptual diagram illustrating the pulsed light generation device according to the first embodiment.

The following is a description of the pulsed light generation device according to the first embodiment of the present invention, given in reference to drawings. FIG. 1 is a conceptual diagram of the pulsed light generation device according to the first embodiment. As shown in FIG. 1, a pulsed light generation device 100 comprises an optical coupler 101, a connection optical path 102 which is connected to the optical coupler 101, a phase modulation element 103 disposed at the connection optical path 102, and an input unit 104 via which light is input to a first port 1. The optical coupler 101 includes four ports, i.e., the first port 1, a second port 2, a third port 3 and a fourth port 4, through which light can be input and output.

The connection optical path 102 is disposed so as to connect the third port 3 and the fourth port 4. The optical coupler 101 may be a fused fiber coupler with a 50:50 branching ratio. It is to be noted that the input unit 104 may be constituted with, for instance, an optical circulator. The optical coupler 101 may be a coupler having a 50:50 branching ratio, which includes a half mirror instead of a fused fiber coupler. It is to be noted that if an optical coupler 101 with a branching ratio other than 50:50 were used, first pulsed light (hereafter may be otherwise referred to as main pulsed light) would contain a pedestal component, which would become more pronounced as the branching ratio deviates from the 50:50 ratio. The term "pedestal component" is used to refer to a stage-shaped component with a lower intensity than the peak intensity, which would precede and follow the pulsed light. For this reason, it is preferred that the optical coupler 101 with a 50:50 branching ratio is used.

The position at which the phase modulation element 103 is disposed is determined so that the optical distance from the phase modulation element 103 to the third port 3 and the optical distance from the phase modulation element 103 to the fourth port 4 are different from each other. The phase modulation element 103 may be constituted with a modulator such as an electro-optic modulator (EO modulator). It is to be noted that while it is preferred that the connection optical path 102 be formed with an optical fiber connected in a loop so as to minimize any change in the phase due to air fluctuation occurring in the optical path, the connection optical path 102 may instead be formed by combining mirrors, for instance. In such a case, the connection optical path may be partially disposed in a vacuum.

Figure 2:
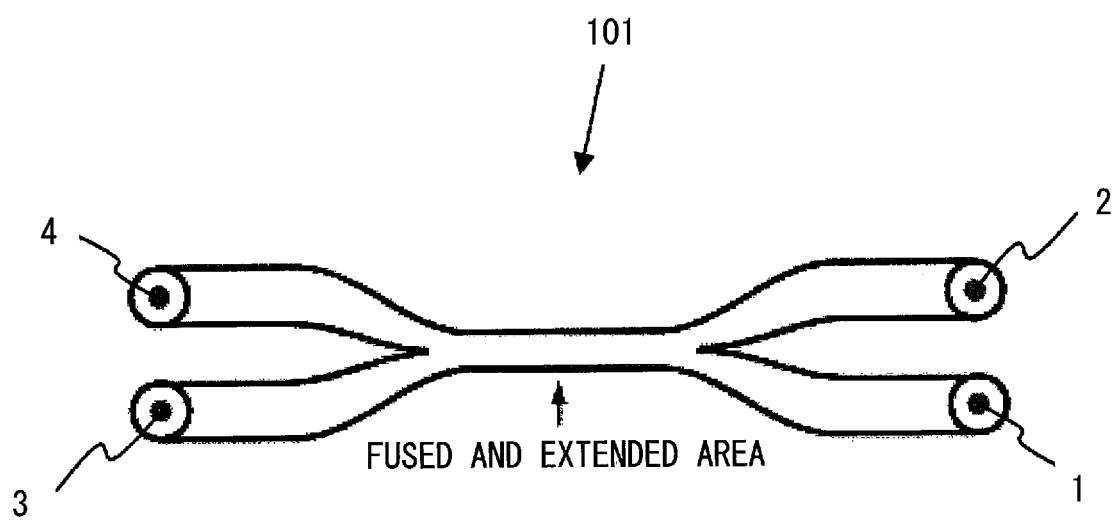
FIG. 2 is a diagram schematically illustrating the structure of a fused fiber coupler.

FIG. 2 is a diagram schematically illustrating the structure of a fused fiber coupler commonly used to constitute the optical coupler 101. In a fused fiber coupler, two optical fibers extend in a shape that they are fused by heating and melting. The optical coupler 101 includes four ports; the first port 1, the second port 2, the third port 3 and the fourth port 4, through which light is input and output. Light, input to any one of ports from the first through fourth, is branched and output from the optical coupler 101. For instance, light having been input to the optical coupler 101 through the first port 1 is branched and output through the third port 3 and the fourth port 4. Alternatively, light having been input to the optical coupler 101 through the third port 3, and light having been input to the optical coupler 101 through the fourth port 4 simultaneously, are multiplexed and then branched so that the light in one branch is output from the first port 1 and the light in the other branch is output from the second port 2.

Figure 3:
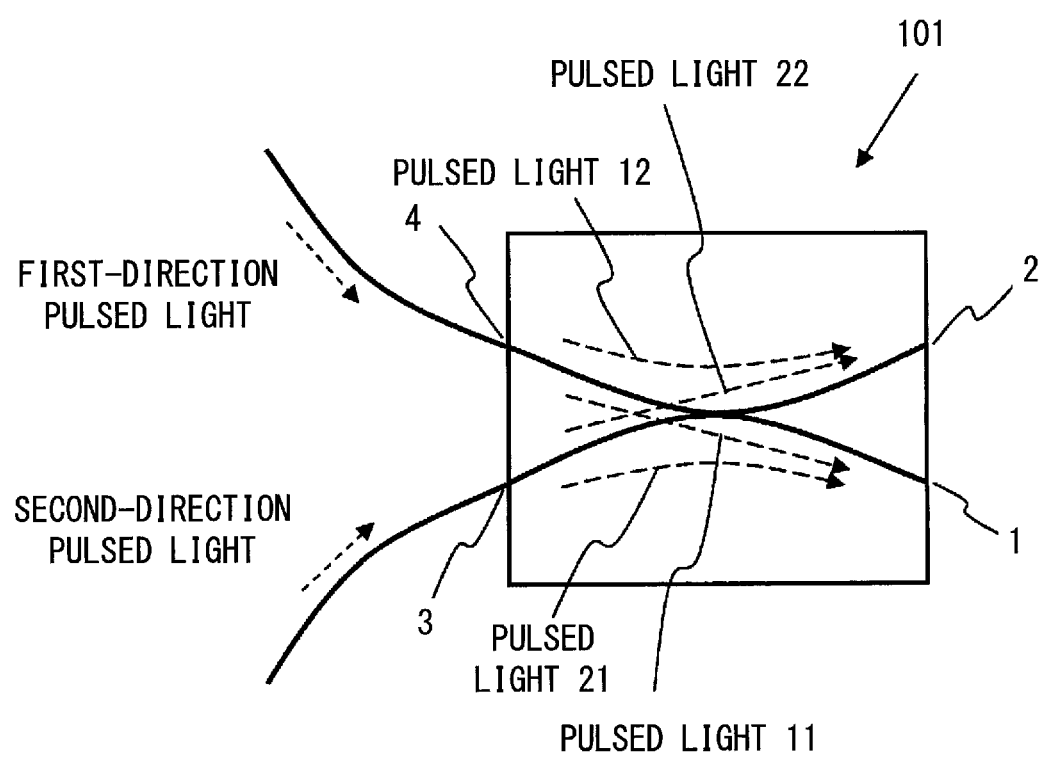
FIG. 3 is a diagram schematically illustrating the port arrangement and light propagation between the individual ports at an optical coupler.

FIG. 3 schematically illustrates the arrangement of the ports at the optical coupler 101 and propagation of light between each of the ports. At the optical coupler 101, the first port 1 and the second port 2 are disposed on one side and the third port 3 and the fourth port 4 are disposed on the other side. In this document, it is described as follows; the first port 1 and the third port 3 are opposing each other, the second port 2 and the fourth port 4 are opposing each other, the first port 1 and the fourth port 4 are not opposing each other or the first port 1 and the fourth port 4 are non-opposing, and the second port 2 and the third port 3 are not opposing each other or the second port 2 and the third port 3 are non-opposing.

As pulsed light is input through the first port 1 to the optical coupler 101, the pulsed light is branched toward the third port 3 opposing the first port 1 and toward the fourth port 4 not opposing the first port 1 and is propagated along each of the branch paths. As pulsed light is input through the second port 2, the pulsed light is branched toward the fourth port 4 opposing the second port 2 and toward the third port 3 not opposing the second port 2 and is propagated along each of the branch paths. As pulsed light is input through the third port 3, the pulsed light is branched toward the first port 1 opposing the third port 3 and toward the second port 2 not opposing the third port 3 and is propagated along each of the branch paths. As pulsed light is input through the fourth port 4, the pulsed light is branched toward the second port 2 opposing the fourth port 4 and toward the first port 1 not opposing the fourth port 4 and is propagated along each of the branch paths.

At the optical coupler 101, light is propagated between ports not opposing each other with its phase delayed by ¼ of the wavelength (hereafter notated as λ/4) relative to the phase of the light propagated between ports opposing each other. In the case of light having been input through the first port 1 and branched to be propagated toward the third port 3 and the fourth port 4, the phase of the light propagated to the fourth port 4 not opposing the first port 1 is delayed by λ/4 relative to the phase of the light propagated to the third port 3 opposing the first port 1.

<The State in which the Phase Modulation Element is not Functioning>

Next, pulsed light input to the input unit 104 of the pulsed light generation device 100 shown in FIG. 1 will be described. A fused coupler having a 50:50 branching ratio is used as the optical coupler 101. The state in which the phase modulation element 103 is not functioning will be explained first. As described earlier, pulsed light input to the input unit 104 is then input to the optical coupler 101 through the first port 1, and is branched inside the optical coupler 101 to be propagated to the third port 3 opposing the first port 1 and to the fourth port 4 not opposing the first port 1 and are individually output to the connection optical path 102.

The pulsed light output from the third port 3 to travel toward the fourth port 4 will be referred to as first-direction pulsed light and the pulsed light output from the fourth port 4 to travel toward the third port 3 will be referred to as second-direction pulsed light. While the first-direction pulsed light is pulsed light output after having been propagated from one port to another port opposing each other in the optical coupler 101, the second-direction pulsed light is pulsed light output after having been propagated from one port to another not opposing each other in the optical coupler 101, and thus, the phase of the second-direction pulsed light is delayed by λ/4 at the time point at which it is output from the fourth port 4, relative to the phase of the first-direction pulsed light at the time point at which it is output from the third port 3.

The first-direction pulsed light is propagated through the connection optical path 102 and then is input to the optical coupler 101 through the fourth port 4. The second-direction pulsed light is propagated through the connection optical path 102 along a direction opposite to the direction in which the first-direction pulsed light travels through the connection optical path 102, and then is input to the optical coupler 101 through the third port 3. The first-direction pulsed light and the second-direction pulsed light are propagated through the common connection optical path 102. This means that the phase of the second-direction pulsed light at which it is input to the optical coupler 101 through the third port 3 is still delayed by λ/4 relative to the phase of the first-direction pulsed light at which it is input to the optical coupler 101 through the fourth port 4.

The first-direction pulsed light input to the optical coupler 101 through the fourth port 4 is branched inside the optical coupler 101 to pulsed light 11 to be propagated toward the first port 1 not opposing the fourth port 4 and to pulsed light 12 to be propagated toward the second port 2 opposing the fourth port 4. The second-direction pulsed light input to the optical coupler 101 through the third port 3 is branched inside the optical coupler 101 to pulsed light 21 to be propagated toward the first port 1 opposing the third port 3 and to pulsed light 22 to be propagated toward the second port 2 not opposing the third port 3. Namely, the pulsed light 11 and the pulsed light 21 are propagated to the first port 1, whereas the pulsed light 12 and the pulsed light 22 are propagated to the second port 2.

An output from the first port 1 will be explained next. The phase of the pulsed light 11, branched out from the first-direction pulsed light, is advanced by an extent equivalent to λ/4 at the time of branching, relative to the phase of the pulsed light 21 branched out from the second-direction pulsed light. However, as the pulsed light 11 is propagated inside the optical coupler 101 between ports not opposing each other, its phase is delayed by an extent equivalent to λ/4 relative to the phase of the pulsed light 21 propagated between ports opposing each other. Thus, at the time point at which the pulsed light 11 and the pulsed light 21 are multiplexed, the phase advance of the pulsed light 11 immediately before it is input to the optical coupler 101 is diminished by the phase delay occurring as the pulsed light 11 is propagated through the optical coupler 101, therefore, the pulsed light 11 has no phase difference relative to the pulsed light 21. Namely, the pulsed light 11 and the pulsed light 21 are set in phase with each other. As a result, pulsed light made up with the pulsed light 11 and the pulsed light 21 intensifying each other is output from the first port 1.

An output from the second port 2 will be explained next. The phase of the pulsed light 22, branched out from the second-direction pulsed light is delayed by an extent equivalent to λ/4 at the time of branching, relative to the phase of the pulsed light 12 branched out from the first-direction pulsed light. In addition, as the pulsed light 22 is propagated inside the optical coupler 101 between ports not opposing each other, its phase is delayed by an extent equivalent to λ/4 relative to the phase of the pulsed light 12 propagated between ports opposing each other. Thus, at the time point at which the pulsed light 12 and the pulsed light 22 are multiplexed, the phase delay occurring as the pulsed light 22 is propagated through the optical coupler 101 is added to the phase delay present as the pulsed light 22 is input to the optical coupler 101. As a result, the phase of the pulsed light 22 is delayed relative to the phase of the pulsed light 12 by an extent equivalent to λ/2 (½ of the wavelength). Thus, the amplitude of the pulsed light 12 and the amplitude of the pulsed light 22 diminish each other and no light is output from the second port 2.

Figure 4:
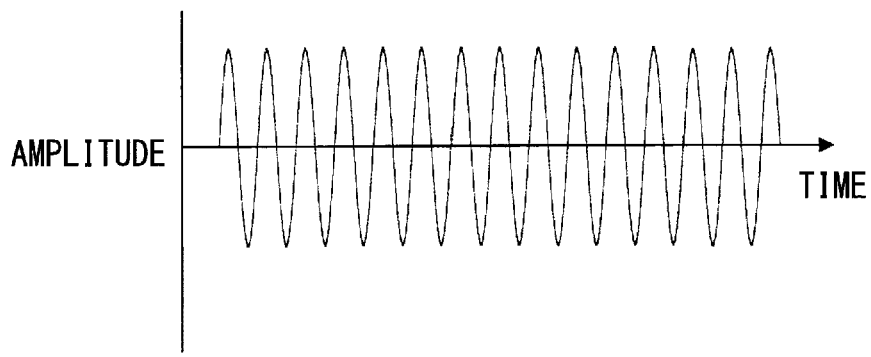
FIG. 4 presents conceptual diagrams explaining multiplexing of two types of pulsed light, with (a) and (b) indicating the amplitudes of the two types of pulsed light that are multiplexed and (c) indicating the waveform of the multiplexed light.
Figure 4:
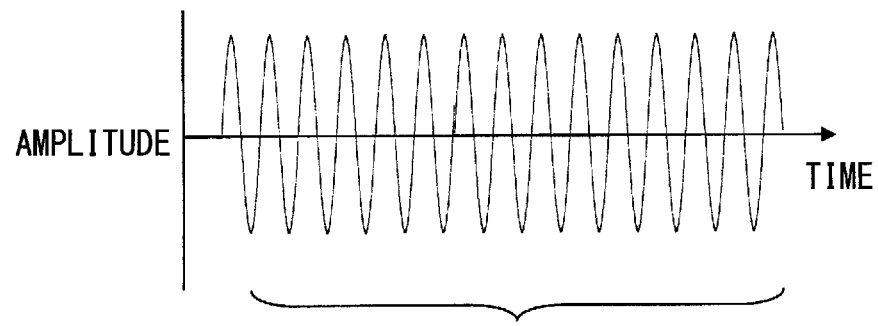
Figure 4:
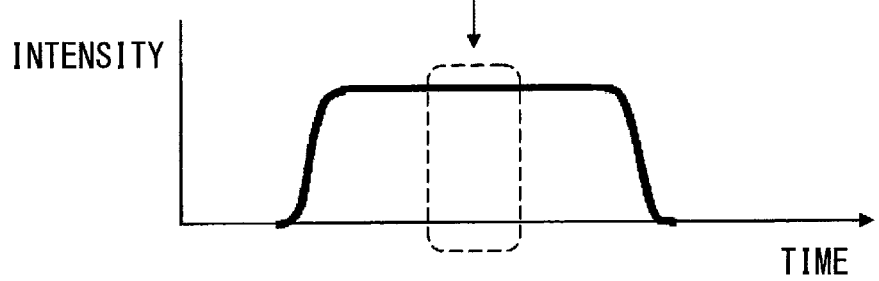
Figure 5:
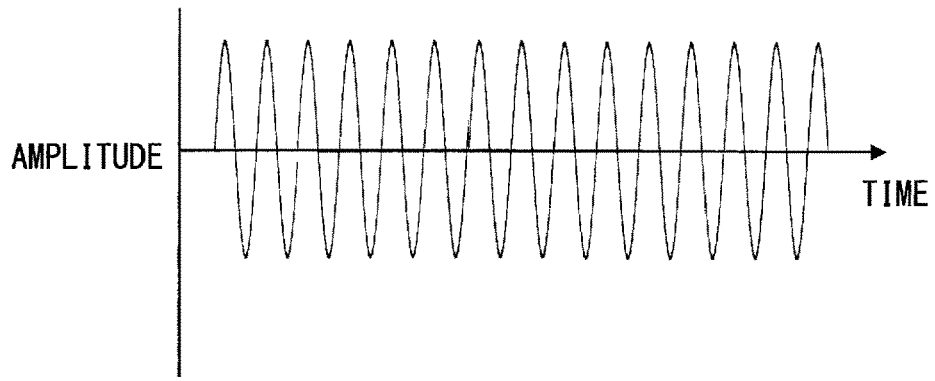
FIG. 5 presents conceptual diagrams explaining multiplexing of two types of pulsed light, with (a) and (b) indicating the amplitudes of the two types of pulsed light that are multiplexed and (c) indicating the waveform of the multiplexed light.
Figure 5:
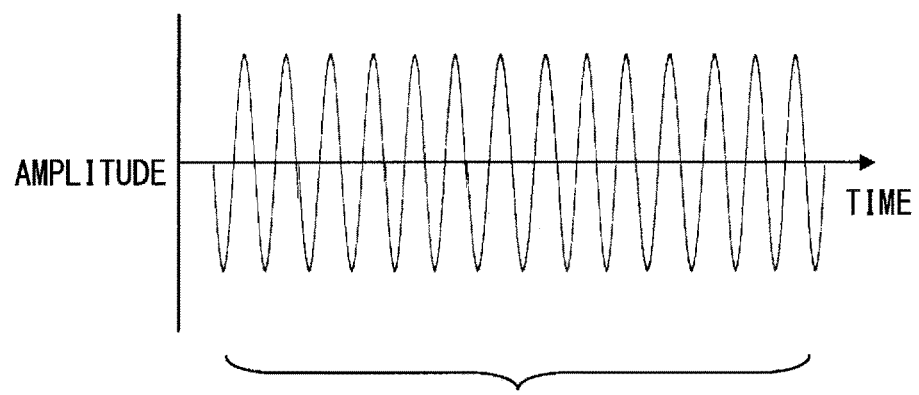
Figure 5:
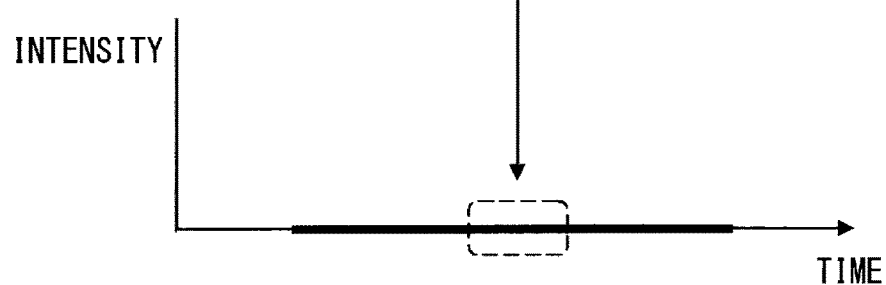

The process described above will be further explained in reference to FIG. 4 and FIG. 5. In FIG. 4, (a) indicates the amplitude of the pulsed light 11, (b) indicates the amplitude of the pulsed light 21 and (c) indicates the waveform of multiplexed light generated by multiplexing the pulsed light 11 and the pulsed light 21. As described earlier, there is no phase difference between the pulsed light 11 and the pulsed light 21. In other words, the amplitudes of the pulsed light 11 and the pulsed light 21 are in phase, as indicated in FIGS. 4(*a*) and (*b*). This means that the pulsed light 11 and the pulsed light 21 intensify each other at the first port 1. As a result, light equivalent to the pulsed light having been input to the input unit 104 is output at the first port 1, as indicated in (c). It is to be noted that in FIG. 4, the amplitudes are indicated in (a) and (b) over a time axis extended relative to the time axis assumed in (c) and that (a) and (b) indicate the amplitudes of the pulsed light 11 and the pulsed light 21 over the time domain indicated by the dotted line in (c).

In FIG. 5, (a) indicates the amplitude of the pulsed light 12, (b) indicates the amplitude of the pulsed light 22 and (c) indicates the waveform of multiplexed light generated by multiplexing the pulsed light 12 and the pulsed light 22. As described earlier, a phase difference equivalent to λ/2 exists between the pulsed light 12 and the pulsed light 22. This means that the phase of the amplitude of the pulsed light 12 and the phase of the amplitude of the pulsed light 22 are inverted from each other, as indicated in (a) and (b). Thus, no light is output at the second port 2 where the pulsed light 12 and the pulsed light 22 cancel each other. It is to be noted that in FIG. 5, the amplitudes are indicated in (a) and (b) over a time axis extended relative to the time axis in (c) and that (a) and (b) indicate the amplitudes of the pulsed light 12 and the pulsed light 22 over the time domain indicated by the dotted line in (c).

The concept described above can be expressed in the form of equations. First, with A(t) representing the amplitude of the pulsed light input through the input unit 104, the amplitude $A_R(t)$ output from the first port 1 can be expressed as in equation (1). It is to be noted that for purposes of simplification, the same time coordinate t is used for both the input pulsed light and the output pulsed light.

$$A_R(t) = \frac{1}{\sqrt{2}} \frac{i}{\sqrt{2}} A(t) + \frac{i}{\sqrt{2}} \frac{1}{\sqrt{2}} A(t) = iA(t) \quad (1)$$

In equation (1), the first term represents the amplitude corresponding to the pulsed light 11 and the second term represents the amplitude corresponding to the pulsed light 21. Namely, equation (1) indicates that the pulsed light output from the first port 1 has an intensity equivalent to that of the pulsed light input to the input unit 104. For purposes of simplification, it is assumed that no loss occurs in the optical path. If the loss occurring in the optical path is taken into consideration, the amplitude of the pulsed light output from the first port 1 will be reduced by an extent corresponding to the attenuation resulting from the loss.

The amplitude $A_T(t)$ of the pulsed light output from the second port 2 may be expressed as in equation (2).

$$A_T(t) = \frac{1}{\sqrt{2}} \frac{1}{\sqrt{2}} A(t) + \frac{i}{\sqrt{2}} \frac{i}{\sqrt{2}} A(t) = 0 \quad (2)$$

In equation (2), the first term represents the amplitude corresponding to the pulsed light 12 and the second term represents the amplitude corresponding to the pulsed light 22. Namely, the equation indicates that no pulsed light is output from the second port 2.

<The Case in which the First-Direction Pulsed Light Undergoes Phase Modulation by ½ of Wavelength (i.e., π)>

Control executed on the phase modulation element 103 so as to delay the phase over a portion of the pulse in the first-direction pulsed light by an extent equivalent to λ/2, i.e., π, will be explained next. The second-direction pulsed light does not undergo any phase modulation. In order to execute phase modulation differently on the first-direction pulsed light and on the second-direction pulsed light (including the case in which only either pulsed light may undergo phase modulation), it must be ensured that the first-direction pulsed light and the second-direction pulsed light do not pass through the phase modulation element 103 simultaneously. For this reason, the phase modulation element 103 is disposed at a position at which different optical distances are achieved to the third port 3 and to the fourth port 4. Through these measures, the timing with which the first-direction pulsed light passes through the phase modulation element 103 is offset from the timing with which the second-direction pulsed light passes through the phase modulation element 103. The difference between the two optical distances is set based upon the pulse duration of the pulsed light input through the input unit 104 and the time length over which the phase modulation is executed on the first-direction pulsed light.

Figure 6:
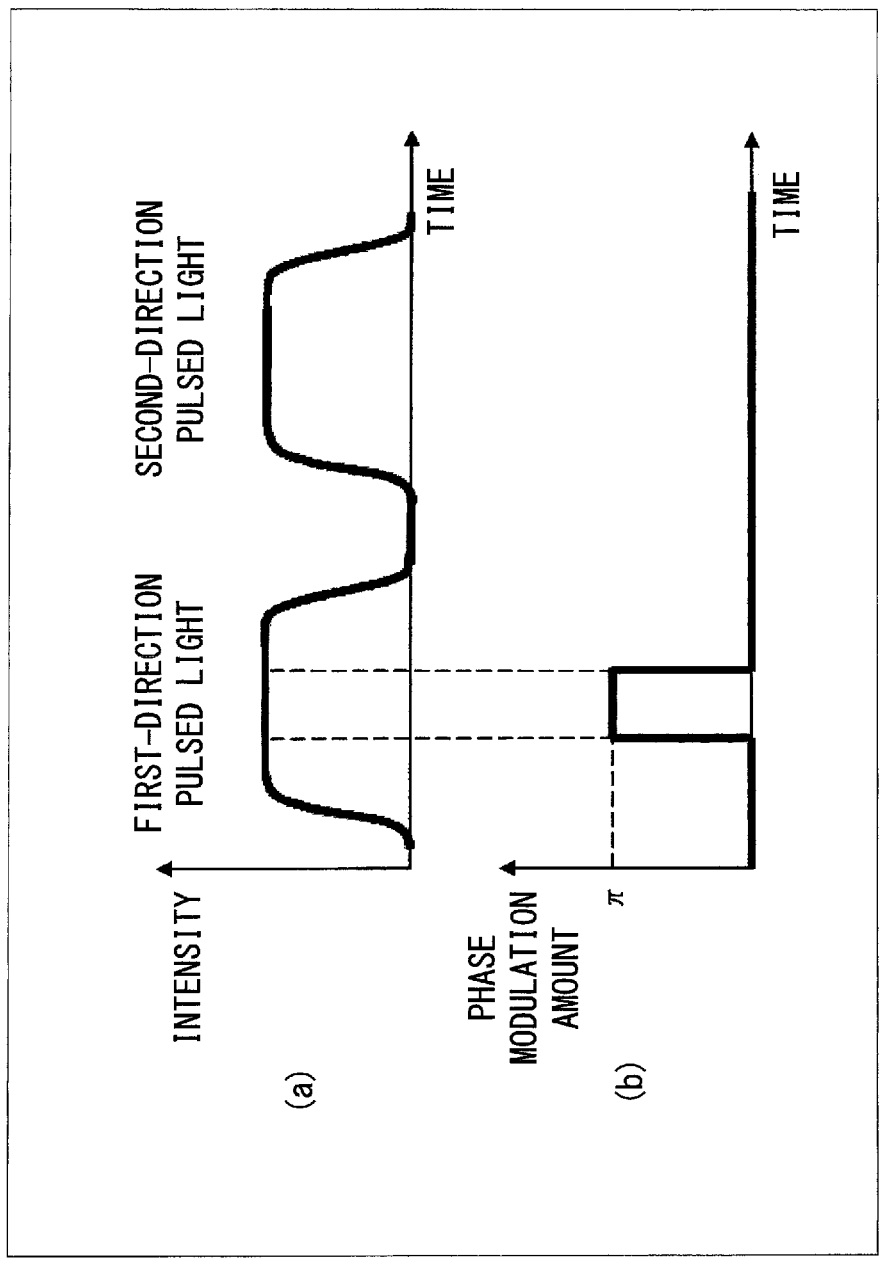
FIG. 6 presents conceptual diagrams illustrating phase modulation occurring over a portion of pulsed light, with (a) indicating the waveform of the pulsed light and (b) indicating that phase modulation at the central portion of the pulse.

FIG. 6 presents a conceptual diagram illustrating phase modulation executed on the first-direction pulsed light alone over a portion of the pulse. The waveforms of the first-direction pulsed light and the second-direction pulsed light at the phase modulation element 103 are indicated in (a), whereas (b) indicates that phase modulation is executed on the central portion of the pulse in the first-direction pulsed light over a predetermined length of time by an extent equivalent to λ/2 (i.e., π). In other words, the central portion of the pulse in the first-direction pulsed light alone undergoes phase modulation so that its phase is delayed by λ/2. As (a) indicates, the first-direction pulsed light and the second-direction pulsed light passes through the phase modulation element 103 in sequence. However, the phase modulation element 103 executes phase modulation on a portion of the pulse in the first-direction pulsed light alone and the second-direction pulsed light does not undergo any phase modulation at the phase modulation element 103, as indicated in (b). Thus, the second-direction pulsed light passes through the phase modulation element 103 with its phase remaining unaltered.

Figure 7:
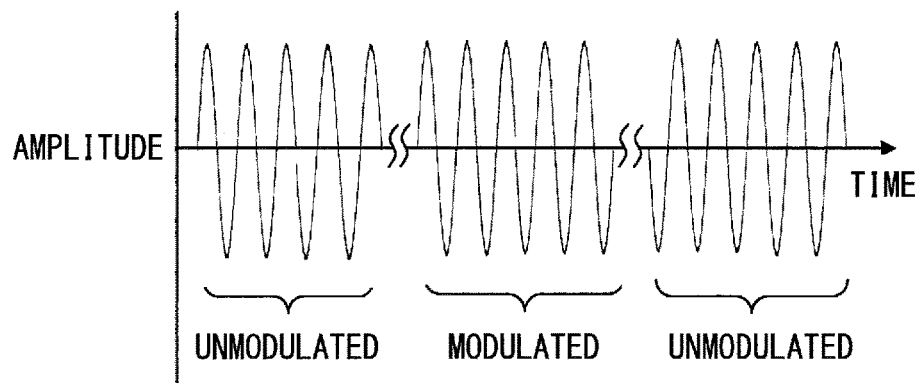
FIG. 7 presents conceptual diagrams illustrating phase modulation of pulsed light, with (a) and (b) indicating the amplitudes of two types of pulsed light that are multiplexed and (c) indicating the waveform of the multiplexed light.
Figure 7:
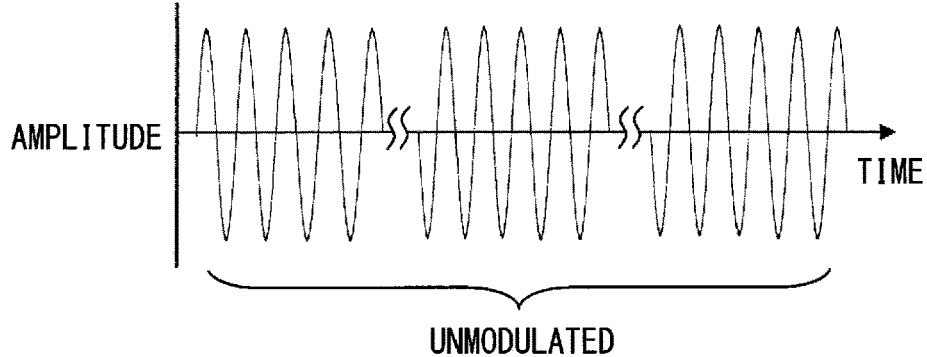
Figure 7:
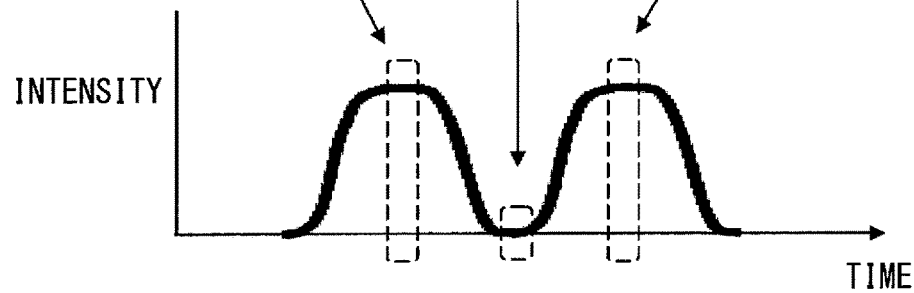

FIG. 7 presents conceptual diagrams of the amplitudes of the pulsed light 11 and the pulsed light 21 and the intensity of the light generated by multiplexing the pulsed light 11 and the pulsed light 21 at the first port 1 in the case in which only the central portion of the pulse in the first-direction pulsed light undergoes phase modulation, as illustrated in FIG. 6. In FIG. 7, the amplitude of the pulsed light 11 is indicated in (a), the amplitude of the pulsed light 21 is indicated in (b) and the waveforms of the multiplexed light generated by multiplexing the pulsed light 11 and the pulsed light 21 is indicated in (c). The amplitudes of the pulsed light 11 and the pulsed light 21 over three time domains are individually indicated in (a) and (b).

The middle time domain among the three time domains corresponds to the time domain during which the first-direction pulsed light undergoes the phase modulation, whereas the two time domains on the left side and the right side correspond to the time domains during which no phase modulation is executed on the first-direction pulsed light. As (a) and (b) indicate, in the time domain in which the phase of the first-direction pulsed light is modulated so that it is delayed by λ/2, the phase of the pulsed light 11 changes by an extent corresponding to λ/2. The amplitude of the pulsed light 21 remains the same as that shown in FIG. 4(*b*), since the second-direction pulsed light does not undergo any phase modulation. As a result, the phase of the amplitude of the pulsed light 11 and the phase of the amplitude of the pulsed light 21 become inverted relative to each other and thus the pulsed light 11 and the pulsed light 21 cancel each other in the time domain during which the phase modulation is executed. In other words, no light is output from the first port 1 over the time domain during which the phase modulation is being executed.

In the time domains during which the first-direction pulsed light does not undergo phase modulation, the amplitude of the pulsed light 11 and the amplitude of the pulsed light 21 are in phase with each other. This means that the pulsed light 11 and the pulsed light 21 intensify each other and thus, light is output from the first port 1 over the time domains in which no phase modulation is executed. As a result, sub pulsed light, which is generated at the first port 1 by multiplexing the pulsed light 11 and the pulsed light 21, has a waveform in the shape of a pair of pulses with two peaks as indicated in (c).

At the start of the phase modulation executed on the first-direction pulsed light, a rising time of, for instance, 10 ps needs to elapse before a phase modulation amount equivalent to λ/2 is achieved. During this rising time, the phase of the first-direction pulsed light changes gradually, and thus, the phase of the pulsed light 11, too, changes gradually. Namely, during the rising time, the pulsed light 11 and the pulsed light 21, initially intensifying each other, gradually shift into a state in which they diminish each other.

The condition toward the end of the phase modulation executed on the first-direction pulsed light is reversed from that described above. Namely, a falling time of, for instance, 10 ps needs to elapse before the phase modulation amount equivalent to λ/2 is reduced to zero. During the falling time, the pulsed light 11 and the pulsed light 21, initially diminishing each other, gradually shift into a state in which they intensify each other. Through the process described above, the intensity of the multiplexed light generated by multiplexing the pulsed light 11 and the pulsed light 21 is gradually lowered from a first peak intensity until it becomes zero, and then it starts to gradually rise until it reaches a second peak intensity, as indicated in (c). It is to be noted that in FIG. 7, the amplitudes are indicated in (a) and (b) over a time axis extended relative to the time span assumed in (c) and that the amplitudes of the pulsed light 11 and the pulsed light 21 are individually indicated in (a) and (b) in correspondence to the three time domains which are indicated with the dotted lines in (c).

Figure 8:
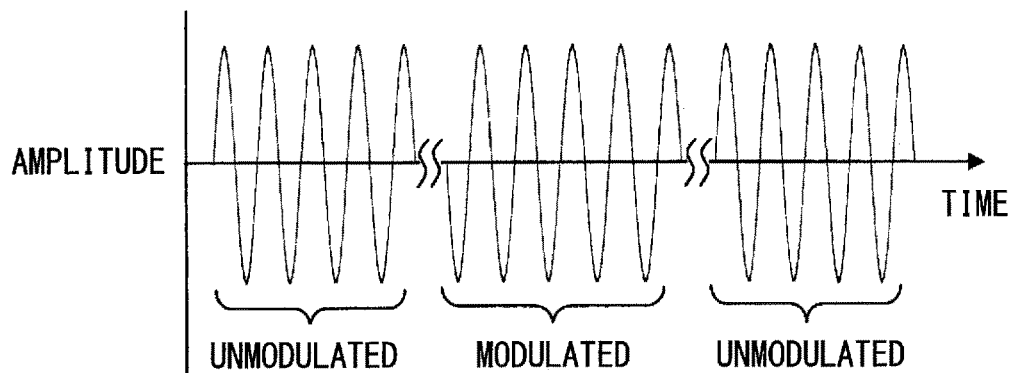
FIG. 8 presents conceptual diagrams illustrating phase modulation of pulsed light, with (a) and (b) indicating the amplitudes of two types of pulsed light that are multiplexed and (c) indicating a waveform of the multiplexed light.
Figure 8:
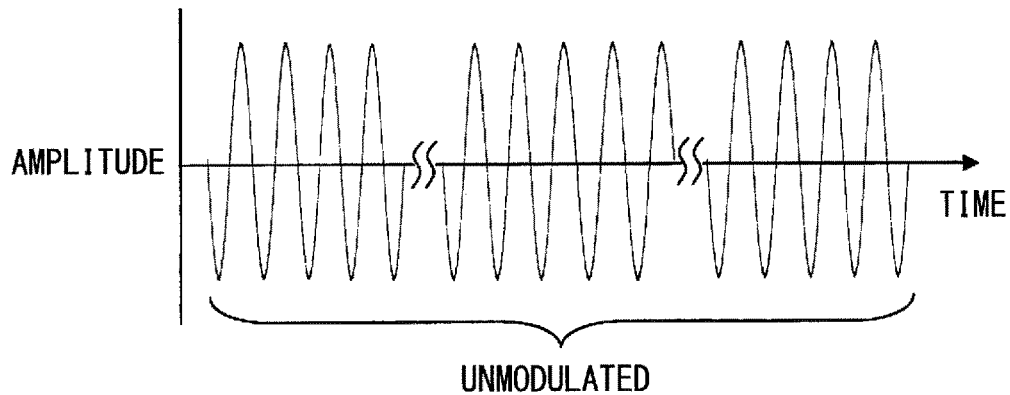
Figure 8:
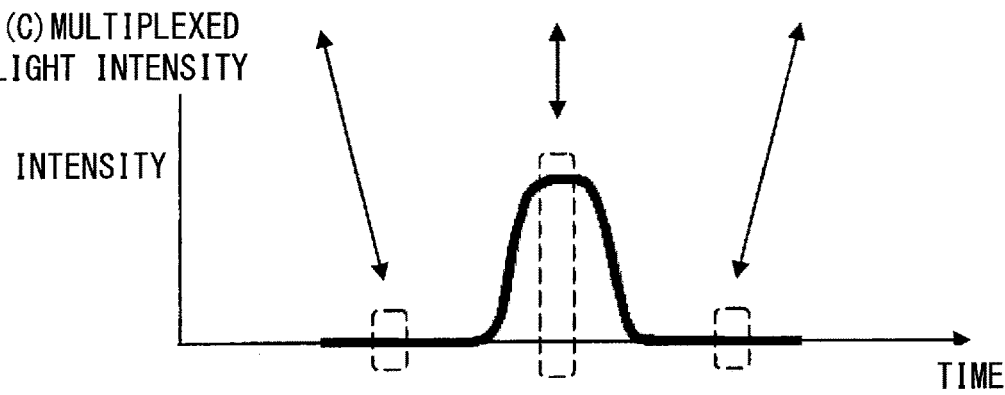

FIG. 8 presents conceptual diagrams of the amplitudes of the pulsed light 12 and the pulsed light 22 and the intensity of the light generated by multiplexing the pulsed light 12 and the pulsed light 22 at the second port 2 in the case in which only the central portion of the pulse in the first-direction pulsed light undergoes phase modulation, as illustrated in FIG. 6. In FIG. 8, the amplitude of the pulsed light 12 is indicated in (a), the amplitude of the pulsed light 22 is indicated in (b) and the waveform of the multiplexed light generated by multiplexing the pulsed light 12 and the pulsed light 22 is indicated in (c). The amplitudes of the pulsed light 12 and the pulsed light 22 over three time domains are individually indicated in (a) and (b), as in FIG. 7.

The middle time domain among the three time domains corresponds to the time domain during which the first-direction pulsed light undergoes the phase modulation, whereas the two time domains on the left side and the right side correspond to the time domains during which no phase modulation is executed on the first-direction pulsed light. As (a) and (b) indicate, in the time domain in which the phase of the first-direction pulsed light is modulated so that it is delayed by λ/2, the phase of the pulsed light 12 changes by an extent corresponding to λ/2. The amplitude of the pulsed light 22 remains the same as that shown in FIG. 5(b), since the second-direction pulsed light does not undergo any phase modulation. As a result, the amplitude of the pulsed light 12 and the amplitude of the pulsed light 22 are in phase with each other and thus, the pulsed light 12 and the pulsed light 22 intensify each other in the time domain in which the phase modulation is executed. In other words, light is output from the second port 2 over the time domain during which the phase modulation is executed.

In the time domains during which the first-direction pulsed light does not undergo phase modulation, the phase of the amplitude of the pulsed light 12 and the phase of the amplitude of the pulsed light 22 are inverted from each other and thus, the pulsed light 12 and the pulsed light 22 cancel each other. In other words, no light is output from the second port 2 during the time domains in which no phase modulation is executed. As a result, main pulsed light, which is generated at the second port 2 by multiplexing the pulsed light 12 and the pulsed light 22, has a waveform with short pulse duration as indicated in (c).

During the rising time and the falling time at the start and at the end of the phase modulation executed on the first-direction pulsed light, conditions similar to those described in reference to FIG. 7 occur. Namely, during the rising time, the pulsed light 12 and the pulsed light 22, initially diminishing each other, gradually shift into a state in which they intensify each other. In contrast, during the falling time, the pulsed light 12 and the pulsed light 22, initially intensifying each other, gradually shift into a state in which they diminish each other. It is to be noted that in FIG. 8, the amplitudes are indicated in (a) and (b) over a time axis extended relative to the time axis assumed in (c) and that the amplitudes of the pulsed light 12 and the pulsed light 22 are individually indicated in (a) and (b) in correspondence to the three time domains which are indicated with the dotted lines in (c).

As FIG. 7 and FIG. 8 clearly indicate, a waveform of the first pulsed light takes on a shape that is complementary to the shape of the waveform in the central portion of the pulses in the second pulsed light. Namely, the intensity of the second pulsed light decreases while the intensity of the first pulsed light increases, and the intensity of the second pulsed light increases while the intensity of the first pulsed light decreases. As will be explained later, by multiplexing two types of pulsed light having these characteristics (i.e., main pulsed light and sub pulsed light) and amplifying the multiplexed light, pulsed light having a high intensity can be obtained while suppressing any broadening of the wavelength spectrum.

The pulsed light output from the second port 2 will be explained by using mathematical equations. With A(t) representing the amplitude of the pulsed light input through the input unit 104 and ϕ(t) representing the phase modulation executed on the first-direction pulsed light, the amplitude $A_T(t)$ of the main pulsed light generated by multiplexing the pulsed light 12 and the pulsed light 22, output from the second port 2, can be expressed as in the following equation (3).

$$A_T(t) = \frac{1}{\sqrt{2}} e^{i\phi(t)} \frac{1}{\sqrt{2}} A(t) + \frac{i}{\sqrt{2}} \frac{i}{\sqrt{2}} A(t) \tag{3}$$

In equation (3), the first term represents the amplitude corresponding to the pulsed light 12 and the second term represents the amplitude corresponding to the pulsed light 22. There is no phase modulation factor present in the second-direction pulsed light, since it does not undergo phase modulation. It is to be noted that for purposes of simplification, the same time coordinate t is used for both the input pulsed light and the output pulsed light.

Equation (3) can be modified into the following equation (4).

$$A_T(t) = iA(t)\exp\left(i\frac{\phi(t)}{2}\right)\sin\left(\frac{\phi(t)}{2}\right) \tag{4}$$

Equation (4) indicates that the amplitude of the main pulsed light output from the second port 2 is calculated by multiplying the amplitude A(t) of the pulsed light input to the input unit 104 by the phase modulation ϕ(t)/2 and the amplitude modulation sin(ϕ(t)/2). The intensity $I_T(t)$ of the main pulsed light can be expressed in equation (5) below.

$$I_T(t) = I(t)\sin^2\left(\frac{\phi(t)}{2}\right) \quad (5)$$

I(t) in the equation above represents the intensity of the pulsed light input to the input unit 104.

The waveform $I_R(t)$ of the sub pulsed light output from the first port 1 can be expressed as in the equation (6) below.

$$I_R(t) = I(t) - I_T(t) \quad (6)$$

Accordingly, if the first-direction pulsed light alone undergoes phase modulation by an extent equivalent to ½ wavelength as indicated in FIG. 6, waveforms of the main pulsed light and the sub pulsed light are respectively shown as indicated in FIG. 8(c) and FIG. 7(c). It is to be noted that since the main pulsed light and the sub pulsed light are generated simultaneously at the same phase modulation element based upon a single phase modulation waveform $\phi(t)$, in principle, no jitter occurs between them. However, if main pulsed light and sub pulsed light were generated based upon different phase modulation waveforms or via different phase modulation elements even based upon the same phase modulation waveform $\phi(t)$, jitter would inevitably occur between the main pulsed light and the sub pulsed light.

In above description, phase modulation is executed on the first-direction pulsed light alone with the second-direction pulsed light undergoing no phase modulation. However, similar results may be obtained through phase modulation executed differently from this. Phase modulation must be executed under conditions described below in order to achieve similar results. Namely, the phases of the two pulsed light propagated toward the first port 1 to be multiplexed at the first port 1 need to achieve a relationship whereby the portion of the pulsed light that undergoes phase modulation and the corresponding portion of the other pulsed light destructively interfere. At the same time, the phases of the two pulsed light propagated to the second port 2 need to achieve a relationship whereby the portion of the pulsed light that undergoes phase modulation and the corresponding portion of the other pulsed light constructively interfere.

Such phase relationships can be achieved by setting the difference between the phase modulation amount representing the extent of phase modulation occurring in the first-direction pulsed light and the phase modulation amount representing the extent of phase modulation occurring in the second-direction pulsed light to $\lambda(½+m)$. Here, m is either zero or a natural number. It is to be noted that the phase modulation amount is zero if no phase modulation is executed. As long as these conditions are satisfied, phase modulation may be executed on only a portion of either one of the first-direction pulsed light and the second-direction pulsed light, or modulation may be executed on portions of both the first-direction pulsed light and the second-direction pulsed light.

<The Case in which Phase Modulation is Executed on the Second-Direction Pulsed Light>

Control executed on the phase modulation element 103 so as to delay the phase of the second-direction pulsed light over a portion of the pulse by an extent equivalent to $\lambda/2$ (i.e., $\pi$) without executing any phase modulation on the first-direction pulsed light will be explained next.

First, an output at the first port 1 will be explained. As described earlier, at the time point at which the second-direction pulsed light is output to the connection optical path 102, the second-direction pulsed light manifests a phase difference of $-\lambda/4$ relative to the first-direction pulsed light. The second-direction pulsed light undergoes phase modulation over a portion of the pulse by an extent equivalent to further $-\lambda/2$ by the phase modulation element 103, and then is branched into pulsed light 21 and pulsed light 22 at the optical coupler 101. The pulsed light 21 is propagated to the first port 1. The first-direction pulsed light, on the other hand, is propagated through the connection optical path 102 without undergoing any phase modulation, and is then branched into pulsed light 11 and pulsed light 12 at the optical coupler 101. In the optical coupler 101, the phase of the pulsed light 11 is delayed to an extent equivalent to $-\lambda/4$ relative to the phase of the pulsed light 21. This means that the phase difference manifested by the pulsed light 21 relative to the pulsed light 11 when the pulsed light 11 and the pulsed light 21 are multiplexed is calculated to be;

$$(-\lambda/4)-(-\lambda/4-\lambda/2)=\lambda/2$$

Namely, a phase difference equivalent to a half wavelength occurs. As a result, the pulsed light 11 and the pulsed light 21 cancel each other as they are multiplexed, and thus, the intensity of the multiplexed light is zero. This means that the intensity of the multiplexed light is similar to that indicated in FIG. 7(c).

Next, an output at the second port 2 will be explained. As described earlier, at the time point at which the second-direction pulsed light is output to the connection optical path 102, the second-direction pulsed light manifests a phase difference of $-\lambda/4$ relative to the first-direction pulsed light. The second-direction pulsed light undergoes phase modulation over a portion of the pulse by an extent equivalent to further $-\lambda/2$ at the connection optical path 102, and then is branches into pulsed light 21 and pulsed light 22 in the optical coupler 101. The pulsed light 22 is propagated to the second port 2. The first-direction pulsed light, on the other hand, is propagated through the connection optical path 102 without undergoing any phase modulation, and is then branched into pulsed light 11 and pulsed light 12 at the optical coupler 101. In the optical coupler 101, the phase of the pulsed light 22 is delayed to an extent equivalent to $-\lambda/4$ relative to the pulsed light 12. This means that the phase difference manifested by the pulsed light 22 relative to the pulsed light 12 when the pulsed light 12 and the pulsed light 22 are multiplexed is calculated to be;

$$0-(-\lambda/4-\lambda/2-\lambda/4)=\lambda$$

Namely, a phase difference equivalent to one wavelength occurs. As a result, the pulsed light 12 and the pulsed light 22 intensify each other as they are multiplexed, resulting in generation of pulsed light with a short pulse duration, which is equivalent to the length of time over which the modulation is executed by the phase modulation element 103. This means that the intensity of the multiplexed light is similar to that indicated in FIG. 8(c).

<The Case in which Phase Modulation is Executed on Both the First-Direction Pulsed Light and the Second-Direction Pulsed Light>

Control executed to modulate the phase of the first-direction pulsed light over a portion of the pulse by an extent equivalent to $-\lambda/4$ and modulate the phase of the second-direction pulsed light over a portion of the pulse by an extent equivalent to $+\lambda/4$ will be explained.

First, an output at the first port 1 will be explained. At the time point at which the second-direction pulsed light is output to the connection optical path 102, the second-direction pulsed light manifests a phase difference of $-\lambda/4$ relative to the first-direction pulsed light. The second-direction pulsed light undergoes phase modulation over a portion of the pulse by an extent equivalent to +λ/4 by the phase modulation element 103 in the connection optical path 102, and the second-direction pulsed light is then input from the third port 3 to the optical coupler 101 where it is branched into pulsed light 21 and pulsed light 22. The pulsed light 21 is propagated to the first port 1. After the first-direction pulsed light undergoes phase modulation over a portion of the pulse by the phase modulation element 103 by an extent equivalent to −λ/4, the first-direction pulsed light is input from the fourth port 4 to the optical coupler 101 where it is branched into pulsed light 11 and pulsed light 12. In the optical coupler 101, the phase of the pulsed light 11 is delayed to an extent equivalent to −λ/4 relative to the pulsed light 21. This means that the phase difference manifested by the pulsed light 21 relative to the pulsed light 11 when the pulsed light 11 and the pulsed light 21 are multiplexed is calculated to be;

(−λ/4−λ/4)−(−λ/4+λ/4)=−λ/2

Namely, a phase difference equivalent to a half wavelength occurs. As a result, the pulsed light 11 and the pulsed light 21 cancel each other and thus, the intensity of the multiplexed light is zero. This means that the intensity of the multiplexed light is similar to that indicated in FIG. 7(c).

Next, an output at the second port 2 will be explained. After the first-direction pulsed light undergoes phase modulation over a portion of the pulse by the phase modulation element 103 by an extent equivalent to −λ/4, the first-direction pulsed light is input from the fourth port 4 to the optical coupler where it is branched into pulsed light 11 and pulsed light 12. The pulsed light 12 is propagated to the second port 2. As described earlier, at the time point at which the second-direction pulsed light is output to the connection optical path 102, it manifests a phase difference of −λ/4 relative to the first-direction pulsed light. After the second-direction pulsed light undergoes phase modulation over a portion of the pulse by the phase modulation element 103 by an extent equivalent to +λ/4, the second-direction pulsed light is input from the third port 3 to the optical coupler 101 where it is branched into pulsed light 21 and pulsed light 22. In the optical coupler 101, the phase of the pulsed light 22 is delayed by an extent equivalent to −λ/4 relative to the phase of the pulsed light 12. This means that the phase difference manifested by the pulsed light 22 relative to the pulsed light 12 when the pulsed light 12 and the pulsed light 22 are multiplexed is calculated to be;

(−λ/4)−(−λ/4+λ/4−λ/4)=0

Namely, there is no phase difference. As a result, the pulsed light 12 and the pulsed light 22 intensify each other as they are multiplexed, resulting in generation of pulsed light with a short pulse duration, which is equivalent to the length of time over which the modulation is executed by the phase modulation element 103. This means that the intensity of the multiplexed light is similar to that indicated in FIG. 8(c).

<Alternative Modulation Method 1>

Figure 9:
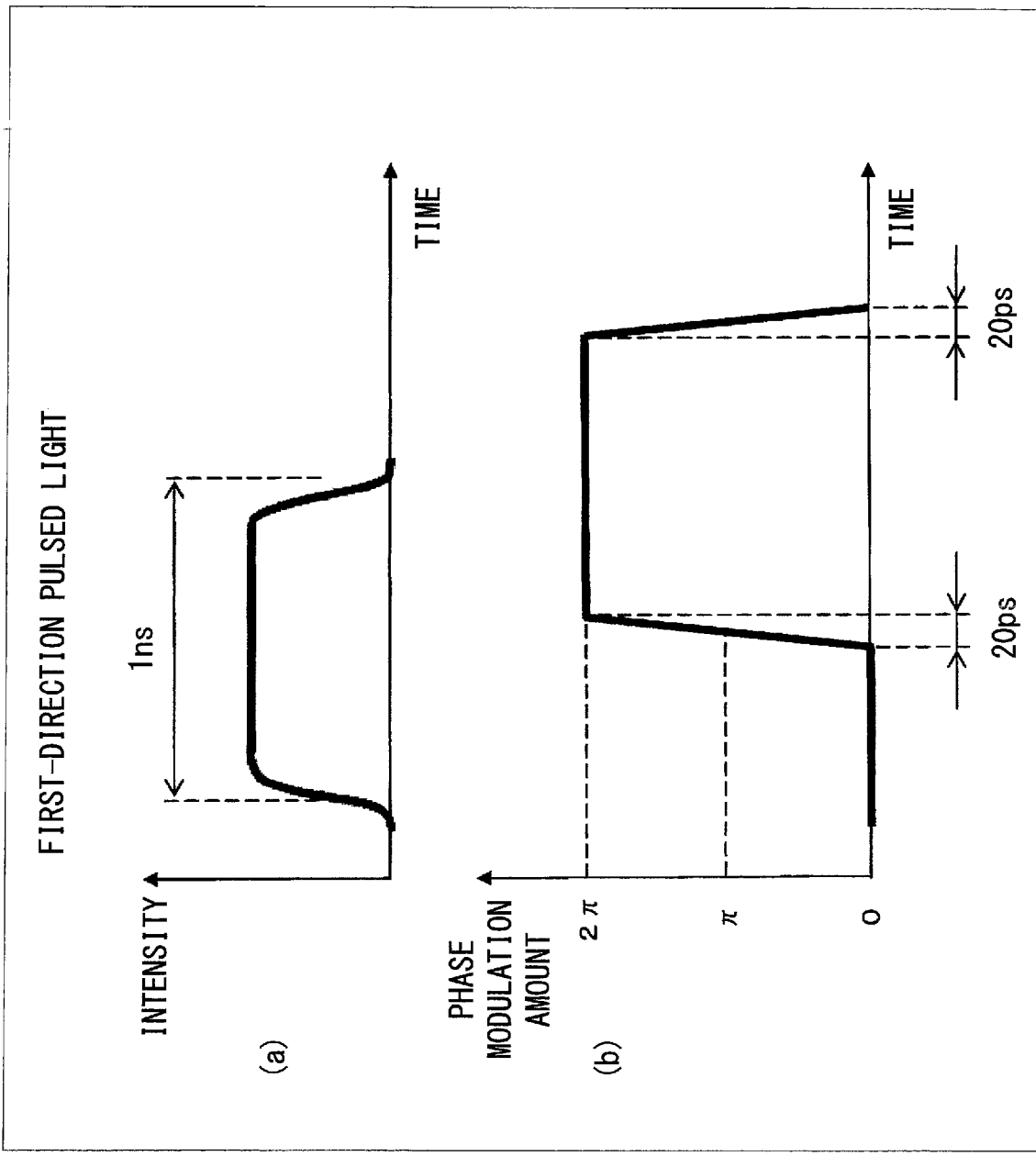
FIG. 9 presents conceptual diagrams illustrating an example of phase modulation, with (a) indicating a waveform of pulsed light and (b) indicating the phase modulation at the central portion of the pulse.

In above description, the phase modulation element 103 is controlled so that phase modulation is executed on, for instance, the first-direction pulsed light over a portion of the pulse, as indicated in FIG. 6. However, the phase modulation element 103 may be controlled through a method other than this in order to generate main pulsed light having a shorter pulse duration compared to the input pulsed light and sub pulsed light that manifests a waveform complementary to that of the main pulsed light. For instance, the phase modulation element 103 may be controlled so as to achieve phase modulation as illustrated in FIG. 9 instead of the phase modulation shown in FIG. 6. The phase modulation in FIG. 9 is achieved by controlling the phase modulation element 103 so that the phase modulation amount applied to the first-direction pulsed light or the second-direction pulsed light propagated through the connection optical path 102, is quickly changed at the center of the pulse from zero to 2π (i.e., equivalent to λ).

As the phase modulation amount is quickly altered as described above, the phase of the first-direction pulsed light or the second-direction pulsed light changes from zero through π and finally to 2π. Since a phase modulation amount 2π is equivalent to a phase modulation amount zero, the change occurring in the phase modulation amount as described above is equivalent to a change achieved by altering the phase modulation amount from zero to π and then returning it to zero. Accordingly, through the control executed on the phase modulation element 103 so as to achieve the phase modulation illustrated in FIG. 9, too, main pulsed light and sub pulsed light are generated respectively at the second port 2 and the first port 1, as through the control method described in reference to FIG. 7 and FIG. 8.

(Variation)

In above description, main pulsed light is generated at the second port 2 and sub pulsed light is generated at the first port 1 by inputting pulsed light from the first port 1 to the optical coupler 101. In the structure according to this variation, main pulsed light is generated at the first port 1 and sub pulsed light is generated at the second port 2 with pulsed light input from the first port 1 to the optical coupler 101.

Figure 10:
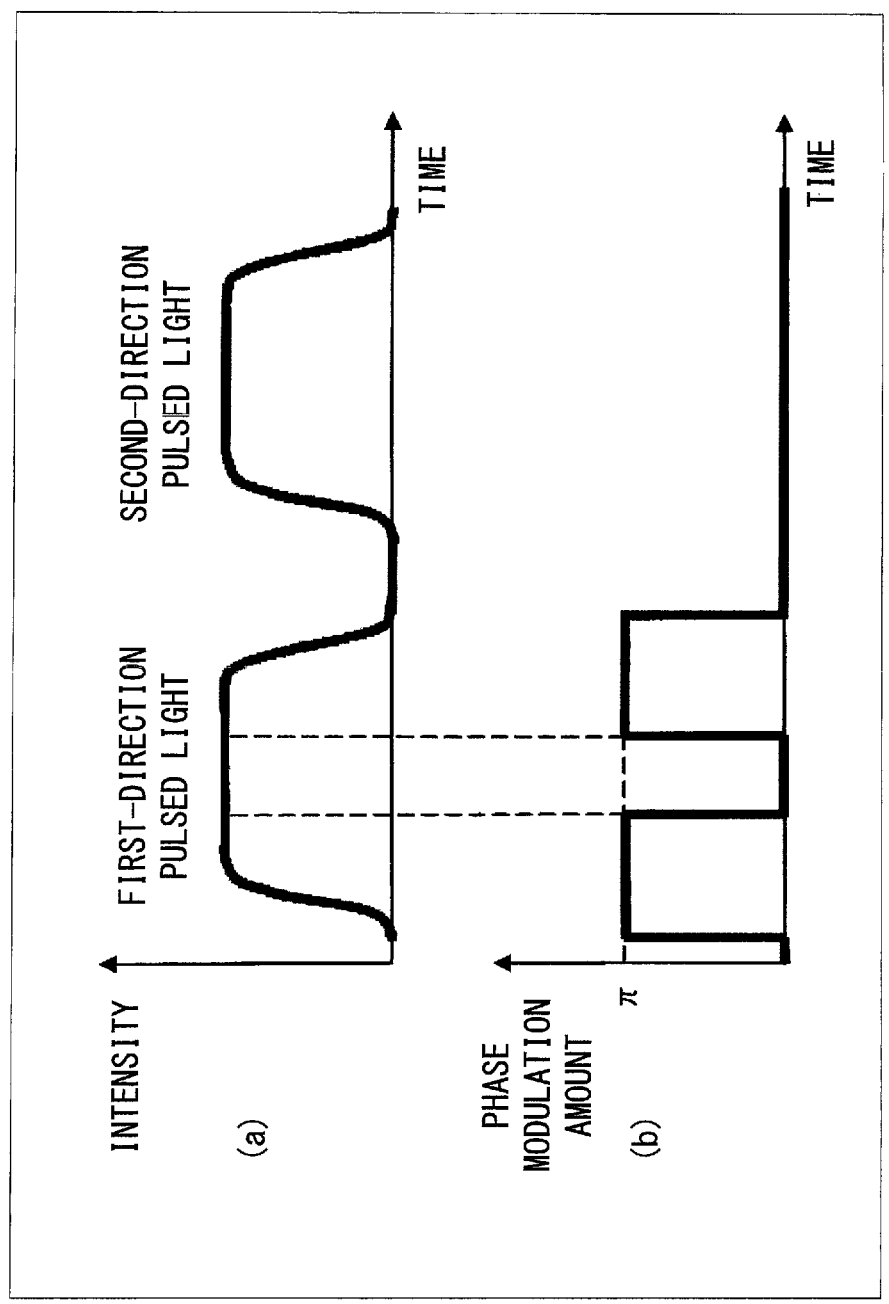
FIG. 10 presents conceptual diagrams illustrating phase modulation of a portion of pulsed light, with (a) indicating a waveform of the pulsed light and (b) indicating the phase modulation at the portions other than the central portion of the pulse.

FIG. 10 presents conceptual diagrams illustrating phase modulation executed on part of the pulse (preceding portion and following portion of the pulse excepting a central portion) in the first-direction pulsed light alone. FIG. 10(a) indicates waveforms of the first-direction pulsed light and the second-direction pulsed light at the phase modulation element 103.

FIG. 10(b) illustrates phase modulation similar to the one obtained by inverting the phase modulation shown in FIG. 6(b), executed on the first-direction pulsed light. Through the phase modulation illustrated in FIG. 6(b), the phase of only the central portion of the pulse in the first-direction pulsed light is modulated by λ/2 (i.e., π) with the remaining portion of the pulse in the first-direction pulsed light undergoing no phase modulation. In contrast, through the phase modulation illustrated in FIG. 10(b), the front portion and the rear portion preceding and following the central portion of the pulse in the first-direction pulsed light undergo phase modulation by an extent equivalent to λ/2 (i.e., π), with the central portion undergoing no phase modulation. It is to be noted that no phase modulation is executed on the second-direction pulsed light.

In more specific terms, phase modulation is executed as described below. Before the first-direction pulsed light is input to the phase modulation element 103, the phase modulation element 103 is set in a state in which the phase of the first-direction pulsed light is modulated by λ/2. The phase modulation element 103 in this state executes phase modulation on the pulse in the first-direction pulsed light so as to modulate the phase of the front portion of the pulse in the first-direction pulsed light. As the central portion of the pulse in the first-direction pulsed light reaches the phase modulation element 103, the phase modulation element 103 pauses the phase modulation. In other words, no phase modulation is executed on the central portion by the phase modulation element 103. Once the central portion of the pulse in the first-direction pulsed light has passed the phase modulation element 103, the phase modulation element 103 resumes the phase modulation executed to an extent equal to λ/2 so as to modulate the phase of the rear portion of the pulse in the first-direction pulsed light by sustaining the phase modulation state until the first-direction pulsed light completely passes through the phase modulation element 103. Once the first-direction pulsed light has passed through the phase modulation element 103, the phase modulation element 103 stops executing phase modulation.

An output at the first port 1 will be explained first. As described earlier, the central portion of the pulse in the first-direction pulsed light does not undergo phase modulation and the second-direction pulsed light does not undergo any phase modulation either. Accordingly, as the central portion of the pulse in the first-direction pulsed light and the second-direction pulsed light are individually input to the optical coupler 101, the pulsed light 11 and the pulsed light 21 intensify each other at the first port 1. This process has already been explained in reference to FIG. 4. The portions of the pulse in the first-direction pulsed light other than the central portion undergo phase modulation by an extent equivalent to λ/2 (i.e., π) as explained above. Accordingly, as the portions of the pulse in the first-direction pulsed light other than the central portion and the second-direction pulsed light are individually input to the optical coupler 101, the pulsed light 11 and the pulsed light 21 cancel each other at the first port 1. This process has already been described in reference to FIG. 5. As a result, main pulsed light having a pulse duration corresponding to the central portion of the pulse in the first-direction pulsed light is generated at the first port 1 (i.e., main pulsed light manifesting a waveform similar to that indicated in FIG. 8(c) is generated). In other words, the main pulsed light same as the main pulsed light generated at the second port 2 in the first embodiment is generated at the first port 1 in this variation.

An output at the second port 2 will be explained next. As described earlier, the central portion of the pulse in the first-direction pulsed light does not undergo phase modulation and the second-direction pulsed light does not undergo any phase modulation, either. Accordingly, as the central portion of the pulse in the first-direction pulsed light and the second-direction pulsed light are individually input to the optical coupler 101, the pulsed light 12 and the pulsed light 22 cancel each other at the second port 2. The portions of the pulse in the first-direction pulsed light other than the central portion, however, undergo phase modulation by an extent equivalent to λ/2 (i.e., π) as explained above. Accordingly, as the first-direction pulsed light and the second-direction pulsed light are individually input to the optical coupler 101, the pulsed light 12 and the pulsed light 22 intensify each other at the second port 2. As a result, sub pulsed light having a waveform taking the shape of a pair of pulses with two peaks is generated at the second port 2 (i.e., sub pulsed light manifesting a waveform similar to that shown in FIG. 7(c) is generated. In other words, the sub pulsed light same as the sub pulsed light generated at the first port 1 in the first embodiment is generated at the second port 2 in this variation.

<Alternative Modulation Method 2>

Figure 11:
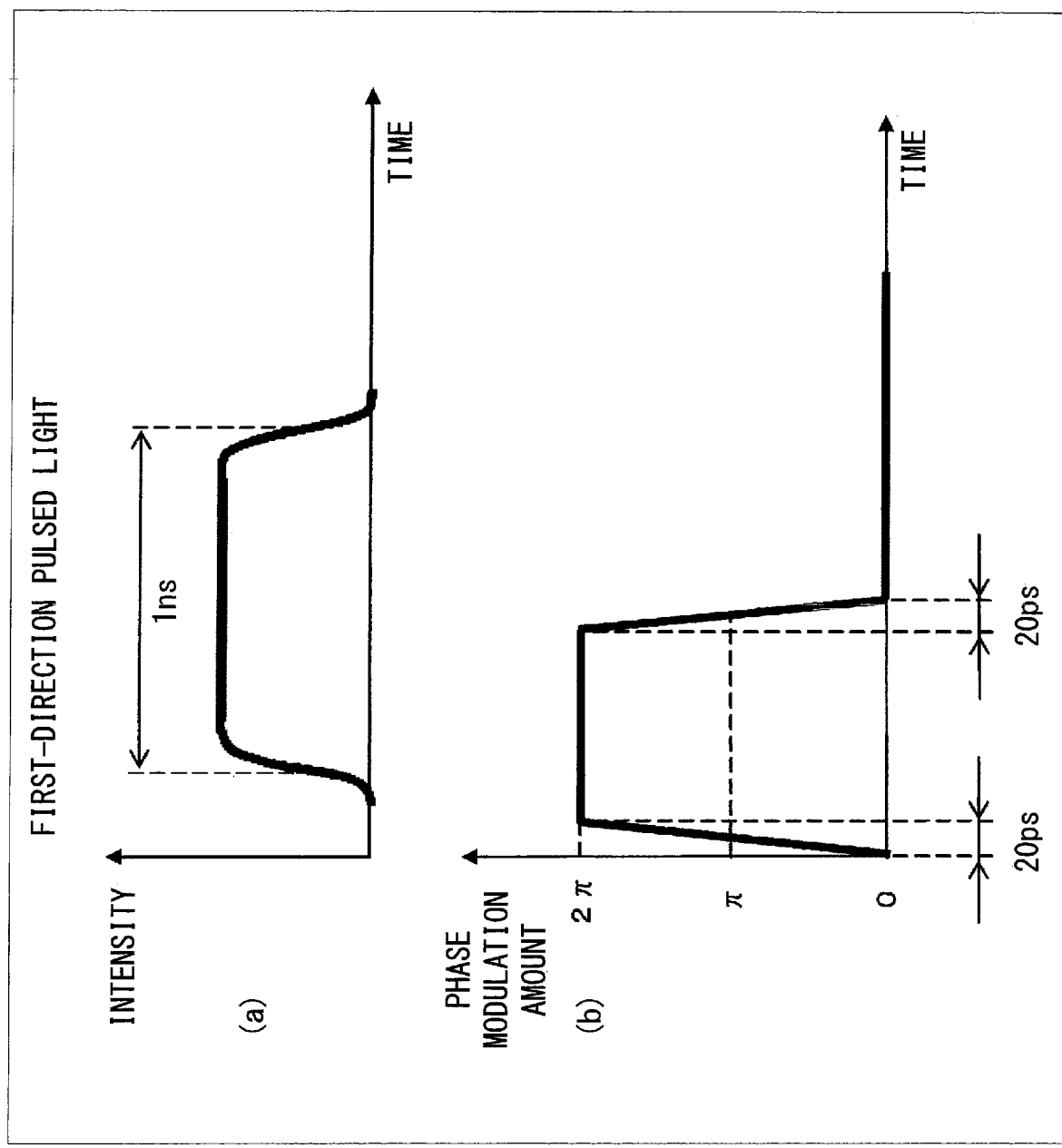
FIG. 11 presents conceptual diagrams illustrating an example of phase modulation, with (a) indicating a waveform of the pulsed light and (b) indicating the phase modulation at the portions other than the central portion of the pulse.

Phase modulation may also be executed on the first-direction pulsed light as described below. FIG. 11 illustrates alternative phase modulation. The phase modulation illustrated in FIG. 11 is achieved by controlling the phase modulation element 103 so that the phase modulation amount is quickly altered by the phase modulation element 103 at the center of the pulse from 2π (i.e., equivalent to λ) to zero for the first-direction pulsed light propagated through the connection optical path 102. In other words, phase modulation similar to the one obtained by inverting the phase modulation executed on the first-direction pulsed light described in reference to FIG. 9, is executed.

As the phase modulation amount is quickly altered the phase of the first-direction pulsed light changes from 2π through π and finally to zero. Since a phase modulation amount 2π is equivalent to a phase modulation amount zero, the change occurring in the phase modulation amount as described above is equivalent to a change achieved by altering the phase modulation amount from zero to π and then returning it to zero. Accordingly, through the control executed on the phase modulation element 103 so as to achieve the phase modulation illustrated in FIG. 11, too, main pulsed light and sub pulsed light are generated respectively at the first port 1 and at the second port 2, as in the variation described earlier.

It is to be noted that while only the phase of the first-direction pulsed light is modulated in above description, similar results can be obtained by modulating the phase of the second-direction pulsed light alone instead of the first-direction pulsed light, as has been explained.

As explained above, with the pulsed light generation device according to the embodiment by adopting a simple structure, main pulsed light and sub pulsed light, with intensity change waveforms with time, different from each other can be generated.

Second Embodiment

Figure 12:
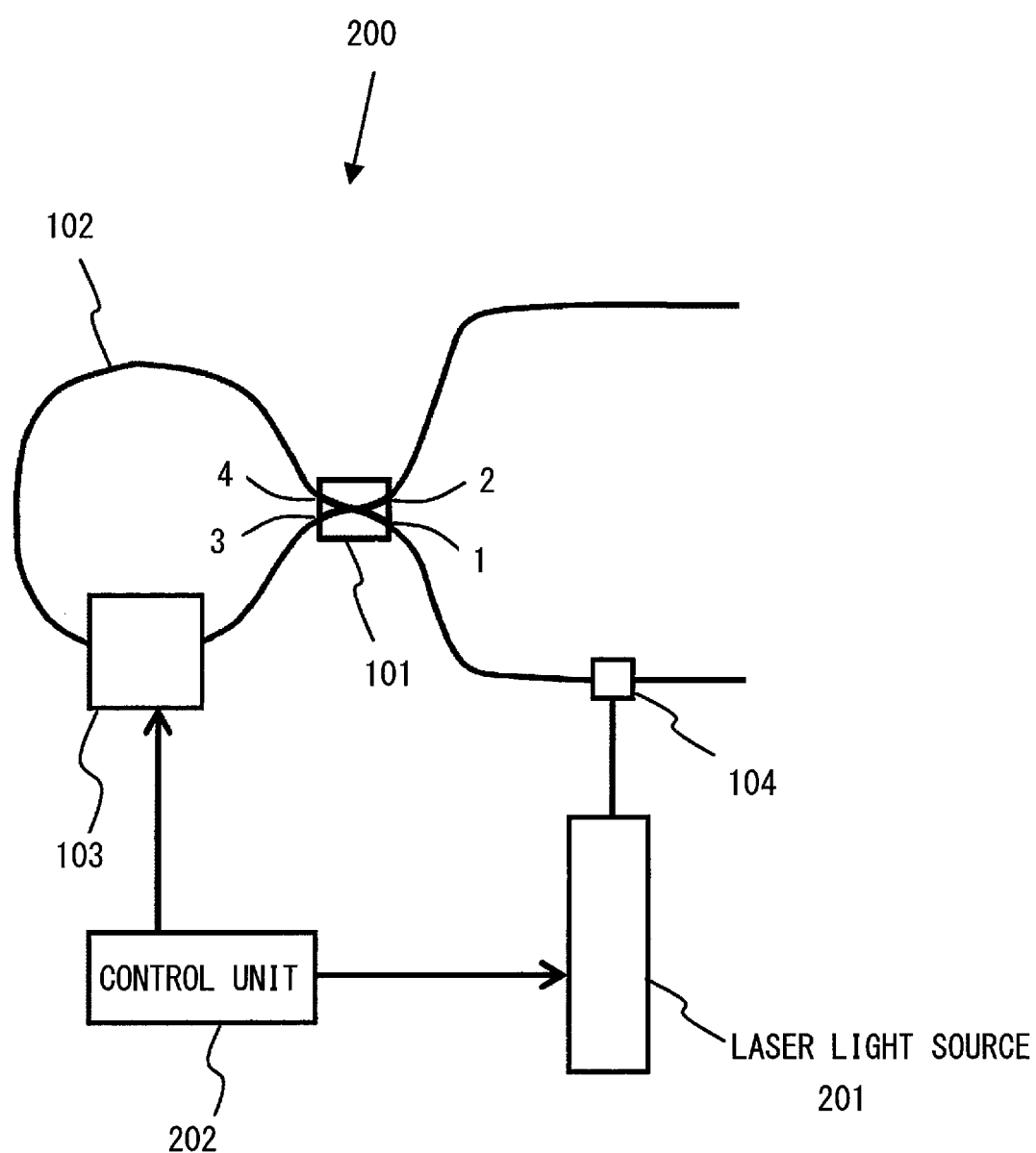
FIG. 12 is a conceptual diagram illustrating the pulsed light generation device according to the second embodiment.

FIG. 12 is a conceptual diagram illustrating a pulsed light generation device 200 according to the second embodiment of the present invention. The pulsed light generation device 200 further comprises a laser light source 201 that outputs pulsed light toward the input unit 104 and a control unit 202, in addition to the structural elements included in the pulsed light generation device 100 in the first embodiment. In FIG. 12, the same reference signs are assigned to components similar to those in the pulsed light generation device 100. The laser light source 201 is preferably constituted with a DFB laser (distributed feedback laser).

The control unit 202 adjusts the light emission duration, the light emission interval, the peak intensity and the like of pulsed light output from the laser light source 201 by controlling a current or a voltage supplied to the laser light source 201. In addition, the control unit 202 adjusts the phase modulation timing and the phase modulation amount with which the phase modulation element 103 executes phase modulation by controlling a current or an electric power supplied to the phase modulation element 103. The control unit 202 executes the control by synchronizing the output of the pulsed light from the laser light source 201 with the phase modulation executed by the phase modulation element 103 so that at least either the first-direction pulsed light or the second-direction pulsed light propagated through the connection optical path 102 partially undergoes phase modulation.

<Generation of Main Pulsed Light and Sub Pulsed Light>

In the pulsed light generation device 200, pulsed light with a pulse duration of 1 ns is output from the laser light source 201 into the input unit 104. The pulsed light input through the input unit 104 is first input to the optical coupler 101 through the first port 1, and is then branched into first-direction pulsed light and second-direction pulsed light to be propagated through the connection optical path 102. The phase modulation element 103 is controlled so that phase modulation is executed only on the first-direction pulsed light over a portion of the pulse.

FIG. 9 presents conceptual diagrams pertaining to an example of phase modulation that may be executed by the phase modulation element 103 on the first-direction pulsed light. The waveform of the first-direction pulsed light is indicated in (a). The pulse duration of the first-direction pulsed light is 1 ns. The phase modulation amount achieved for the first-direction pulsed light and the timing with which the phase modulation is executed are indicated in (b). The control unit 202 controls the laser light source 201 and the phase modulation element 103 so as to modulate the phase of the central portion of the pulse in the first-direction pulsed light from zero to $2\pi$ over a 20 ps time period and to return the modulation amount to zero after the first-direction pulsed light passes through the phase modulation element 103.

Figure 13:
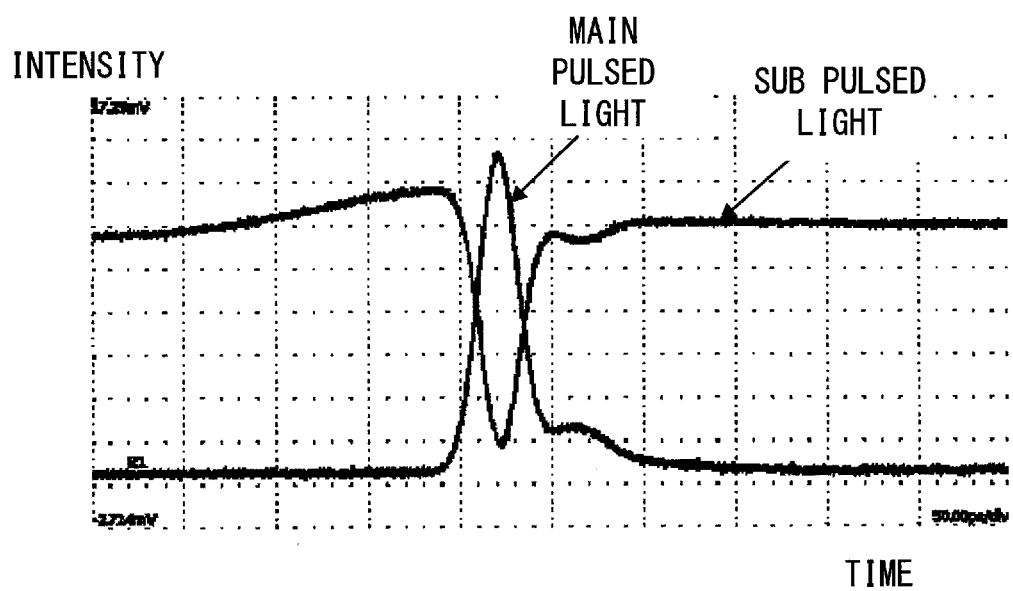
FIG. 13 is a graph presenting measurement results of waveforms of main pulsed light and sub pulsed light.

FIG. 13 presents a graph indicating the results obtained by measuring the waveforms of the sub pulsed light and the main pulsed light generated at the first port 1 and at the second port 2 respectively. FIG. 13 clearly indicates that the main pulsed light is generated at the second port 2 and that the sub pulsed light is generated at the first port 1. The pulse duration of the main pulsed light is approximately 25 ps. Considering that the pulse duration of the pulsed light output from the laser light source 201 is 1 ns, high-quality main pulsed light with a very short pulse duration is generated via the pulsed light generation device 200. In addition, high-quality sub pulsed light having an intensity waveform complementary to that of the main pulsed light is obtained as well. In other words, it can be understood that the intensity of the sub pulsed light decreases while the intensity of the main pulsed light increases, and the intensity of the sub pulsed light increases while the intensity of the main pulsed light decreases.

It is to be noted that FIG. 13 indicates that the intensity of the sub pulsed light initially at a high level becomes lower and then rises again. The waveform of the sub pulsed light is so indicated, since the graph in FIG. 13 is charted over 500 ps (=0.5 ns), which is shorter than the pulse duration of 1 ns of the first-direction pulsed light and thus, the both ends of the sub pulsed light are not included in FIG. 13. However, it is obvious that the sub pulsed light is made up with a pair of pulses having two peaks. Namely, the sub pulsed light is made up with a set of pulses having two peaks, with each pulse having a pulse duration of approximately 500 ps.

With the pulsed light generation device according to the present embodiment as described above by adopting a simple structure, main pulsed light and sub pulsed light can be generated with their waveforms different from each other.

Third Embodiment

Figure 14:
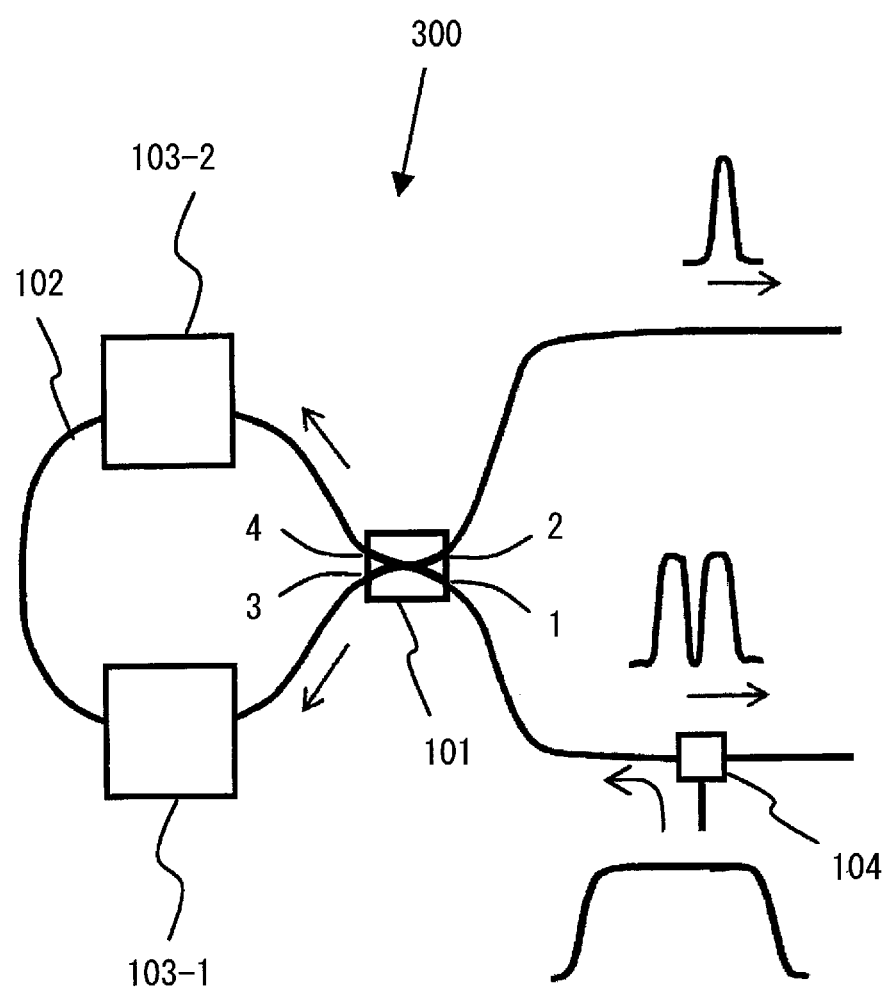
FIG. 14 is a conceptual diagram illustrating the pulsed light generation device according to the third embodiment.

FIG. 14 is a conceptual diagram illustrating a pulsed light generation device 300 according to the third embodiment of the present invention. While the pulsed light generation device 100 includes only one phase modulation element, the pulsed light generation device 300 includes two phase modulation elements, i.e., a first phase modulation element 103-1 and a second phase modulation element 103-2. The pulsed light generation device 300 otherwise adopts a structure similar to that of the pulsed light generation device 100. In FIG. 14, the same reference signs are assigned to structural elements similar to those of the pulsed light generation device 100.

The first phase modulation element 103-1 executes phase modulation on a portion of the pulse in the first-direction pulsed light alone. The second phase modulation element 103-2 executes phase modulation on the second-direction pulsed light alone on a portion of the second direction pulsed light corresponding to the portion of the pulse in the first-direction pulsed light that undergoes the phase modulation at the first phase modulation element 103-1. It is preferred that the phase modulation element achieve phase modulation amounts with matching absolute values, representing directions opposite to each other (with opposite signs). For instance, assuming that a phase modulation amount of $+\lambda/4$ ($+\pi/2$) is achieved at the first phase modulation element 103-1, it is preferred that the phase modulation amount achieved at the second phase modulation element 103-2 be $-\lambda/4$ ($-\pi/2$).

It is to be noted that the first phase modulation element 103-1 and the second phase modulation element 103-2 may each execute phase modulation on both the first-direction pulsed light and the second-direction pulsed light. For instance, the first phase modulation element 103-1 may modulate the phase of a portion of the pulse in the first-direction pulsed light by $+\lambda/8$ ($+\pi/4$) and modulate the phase of a portion of the pulse in the second-direction pulsed light by $-\lambda/8$ ($-\pi/4$). The second phase modulation element 103-2 may modulate the phase of a portion of the pulse in the first-direction pulsed light by $+\lambda/8$ ($+\pi/4$) and modulate the phase of a portion of the pulse in the second-direction pulsed light by $-\lambda/8$ ($-\pi/4$). In this case, a total phase modulation amount of $+\lambda/4$ ($+\pi/2$) is achieved through the two phase modulation elements for the first-direction pulsed light, whereas a total phase modulation amount of $-\lambda/4$ ($-\pi/2$) is achieved through the two phase modulation elements for the second-direction pulsed light. By allowing phase modulation to be executed in this manner, the extent to which the phase needs to be modulated by each phase modulation element through a single execution of phase modulation can be reduced.

It is to be noted that while it is preferred that the phase modulation amounts indicating the extents of phase modulation achieved by the two phase modulation elements have matching absolute values and represent opposite directions, this is not an indispensable requirement. As has been explained in reference to the first embodiment, main pulsed light and sub pulsed light can be generated as long as settings are selected so as to achieve a difference of $\pi(\lambda/2)$ between the phase modulation amount for the first-direction pulsed light and the phase modulation amount for the second-direction pulsed light.

Figure 15:
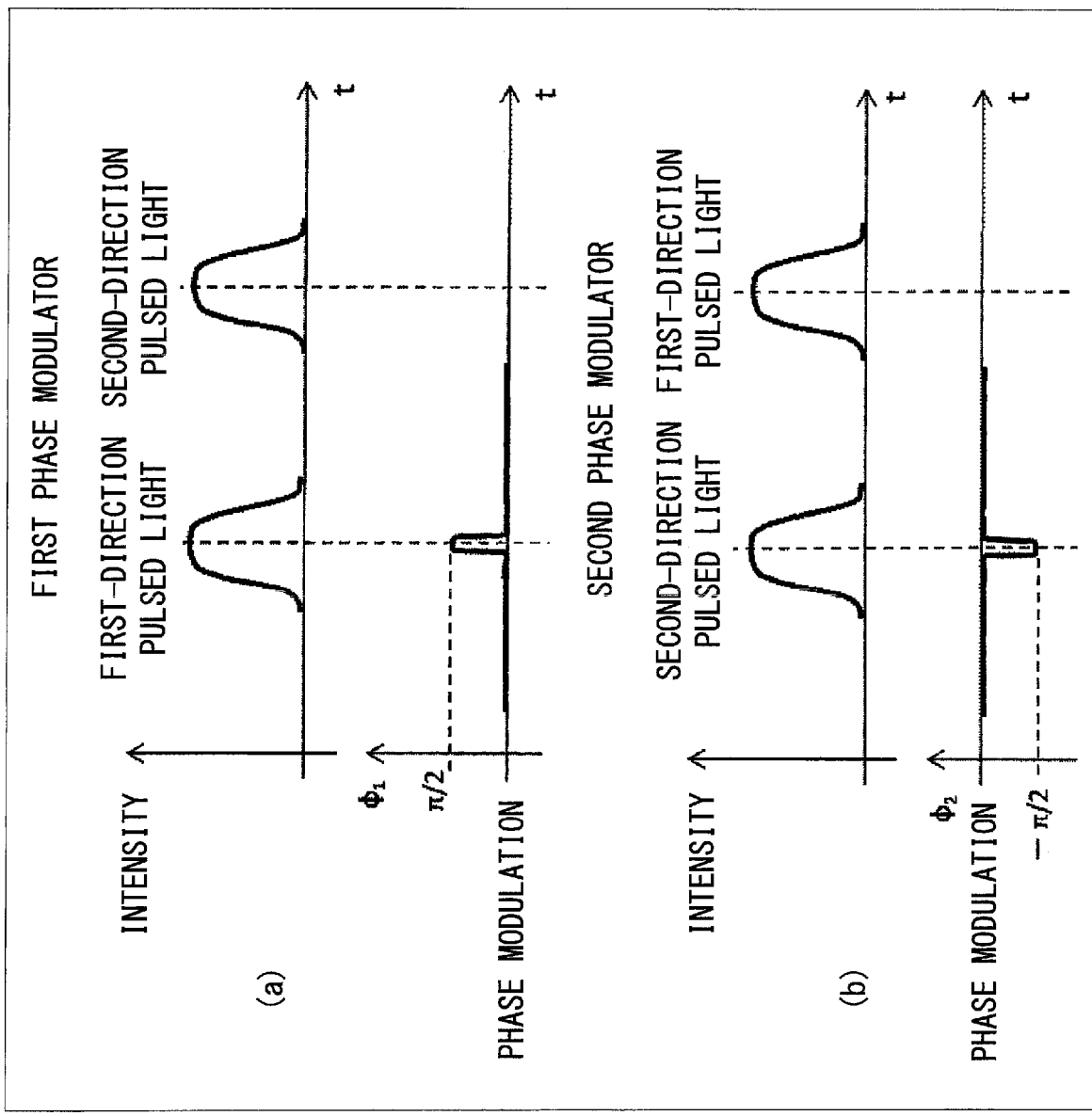
FIG. 15 presents conceptual diagrams illustrating phase modulation according to the third embodiment.

An operation executed in the pulsed light generation device 300 to modulate the phase of the first-direction pulsed light by $\phi_1(t)$ at the first phase modulation element 103-1 and modulate the phase of the second-direction pulsed light by $\phi_2(t)$ at the second phase modulation element 103-2 will be explained in reference to mathematical equations. In this operation, the first phase modulation element 103-1 does not execute phase modulation on the second-direction pulsed light and the second phase modulation element 103-2 does not execute phase modulation on the first-direction pulsed light. FIG. 15 presents conceptual diagrams of the phase modulation executed on the first-direction pulsed light and the phase modulation executed on the second-direction pulsed light respectively by the first phase modulation element 103-1 and the second phase modulation element 103-2.

In FIG. 15, the phase modulation executed by the first phase modulation element 103-1 is illustrated in (a) and the phase modulation executed by the second phase modulation element 103-2 is illustrated in (b). As (a) clearly indicates, the first phase modulation element 103-1 modulates the phase of a portion of the pulse in the first-direction pulsed light alone without executing any phase modulation on the second-direction pulsed light. The second phase modulation element 103-2, on the other hand, modulates the phase of a portion of the pulse in the second-direction pulsed light alone, without executing any phase modulation on the first-direction pulsed light.

With A(t) representing the amplitude of the pulsed light input through the input unit 104, $\phi_1(t)$ representing the phase modulation executed on the first-direction pulsed light and $\phi_2(t)$ representing the phase modulation executed on the second-direction pulsed light, the amplitude $A_T(t)$ of the main pulsed light output from the second port 2 can be expressed as in equation (7) below.

$$A_T(t) = \frac{1}{\sqrt{2}} e^{i\phi_1(t)} \frac{1}{\sqrt{2}} A(t) + \frac{i}{\sqrt{2}} e^{i\phi_2(t)} \frac{i}{\sqrt{2}} A(t) \qquad (7)$$

The first term and the second term in equation (7) respectively represent the amplitude corresponding to the pulsed light 12 and the amplitude corresponding to the pulsed light 22. Equation (7) can be modified into equation (8).

$$A_T(t) = iA(t)\exp\left(i\frac{\phi_1(t) + \phi_2(t)}{2}\right)\sin\left(\frac{\phi_1(t) - \phi_2(t)}{2}\right) \qquad (8)$$

Equation (8) indicates that the amplitude $A_T(t)$ of the main pulsed light is calculated by multiplying the amplitude A(t) of the pulsed light input through the input unit 104 by phase modulation $(\phi_1(t)+\phi_2(t))/2$ and amplitude modulation sin$((\phi_1(t)-\phi_2(t))/2)$. Accordingly, if phase modulation settings are selected so that $\phi_1=-\phi_2$, $(\phi_1(t)+\phi_2(t))/2$ will be zero, and in this case, the amplitude of the main pulsed light can be calculated by multiplying the amplitude A(t) of the input pulsed light by the amplitude modulation alone.

The intensity $I_T(t)$ of the main pulsed light can be expressed as in equation (9) below.

$$I_T(t) = I(t)\sin^2\left(\frac{\phi_1(t) - \phi_2(t)}{2}\right) \qquad (9)$$

It is to be noted that I(t) represents the intensity of the pulsed light input to the input unit 104. The intensity of the sub pulsed light is expressed as; $I_R(t)=I(t)-I_T(t)$, as in equation (6).

In the case in which the first phase modulation element 103-1 modulates the phase of the first-direction pulsed light by +λ/4 (+π/2) and the second phase modulation element 103-2 modulates the phase of the second-direction pulsed light by −λ/4 (−π/2), as illustrated in FIG. 15, sin$((\phi_1(t)+\phi_2(t))/2)=1$, and thus, $I_T(t)=I(t)$ is true.

With the pulsed light generation device according to the present embodiment as described above by adopting a simple structure, main pulsed light and sub pulsed light, with intensity waveforms with time, different from each other can be generated.

Fourth Embodiment

Figure 16:
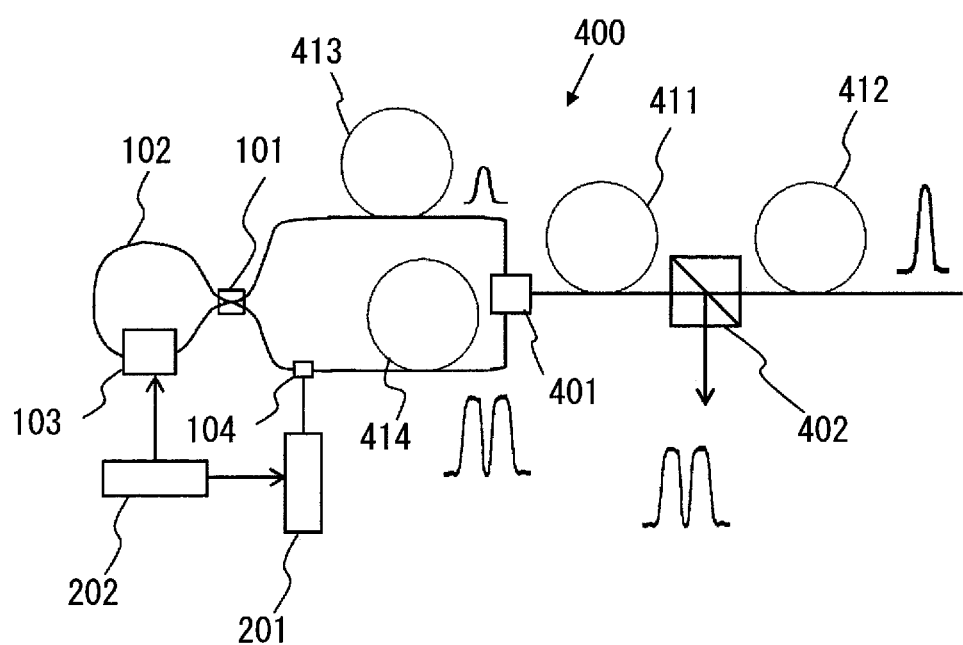
FIG. 16 is a conceptual diagram illustrating the pulsed light generation device according to the fourth embodiment.

FIG. 16 is a conceptual diagram illustrating a pulsed light generation device 400 according to the fourth embodiment of the present invention. The pulsed light generation device 400 further includes a multiplexer element 401, a polarization beam splitter 402, a first optical fiber 411, a second optical fiber 412, a third optical fiber 413 and a fourth optical fiber 414, in addition to the structural elements in the pulsed light generation device 200 according to the second embodiment. In FIG. 16, the same reference signs are assigned to structural elements similar to those in the pulsed light generation device 200.

The multiplexer element 401 multiplexes the main pulsed light and the sub pulsed light having been generated. The polarization beam splitter 402 separates the main pulsed light and the sub pulsed light having been multiplexed by the multiplexer element 401 to main pulsed light and sub pulsed light.

As has been explained earlier in reference to the pulsed light generation device 200, as pulsed light is input from the laser light source 201 to the input unit 104, main pulsed light and sub pulsed light are generated respectively at the second port 2 and at the first port 1. In the pulsed light generation device 400, the main pulsed light and the sub pulsed light input to the polarization beam splitter 402 are polarized so that polarization directions of the main pulsed light and the sub pulsed light are perpendicular to each other. The sub pulsed light is amplified as it is propagated through the fourth optical fiber 414, and is then input to the multiplexer element 401. The main pulsed light is propagated through the third optical fiber 413 and then it is input to the multiplexer element 401.

The third optical fiber 413 is disposed for purposes of optical path length adjustment in order to synchronize the main pulsed light with the sub pulsed light at the multiplexer element 401. It is to be noted that by "synchronizing" the main pulsed light with the sub pulsed light, a state in which the intensity of the sub pulsed light decreases while the intensity of the main pulsed light increases, and the intensity of the sub pulsed light increases while the intensity of the main pulsed light decreases, is achieved. Namely, the main pulsed light and the sub pulsed light are adjusted so as to achieve a complementary relationship with each other.

The main pulsed light and the sub pulsed light having been input to the multiplexer element 401 are multiplexed by the multiplexer element 401 and are then propagated through the first optical fiber 411. This means that the main pulsed light and the amplified sub pulsed light are propagated through the first optical fiber 411. While they are propagated through the first optical fiber 411, phase modulation $\phi_{XPM}$ attributable to cross-phase modulation (XPM) occurs in the main pulsed light under the influence of the sub pulsed light. The multiplexed light, constituted with the main pulsed light and the sub pulsed light, output from the first optical fiber 411 is input to the polarization beam splitter 402 where it is separated to main pulsed light and sub pulsed light. The main pulsed light is propagated through the second optical fiber 412 and is amplified to achieve desired peak intensity. While the main pulsed light is propagated through the second optical fiber 412, phase modulation $(I)_{SPM}$ attributable to self-phase modulation (SPM) occurs in the main pulsed light.

It is to be noted that the sub pulsed light is amplified at the fourth optical fiber 414 so that the peak intensity of the main pulsed light is approximately 1/1000 of the peak intensity of the sub pulsed light at the time point at which the main pulsed light and the sub pulsed light are input to the first optical fiber 411. Since the peak intensity of the main pulsed light is lower than the peak intensity of the sub pulsed light, the extent of the phase modulation occurring in the main pulsed light due to the SPM at the first optical fiber 411 is small enough to be disregarded.

As explained above, the intensities of the main pulsed light and the sub pulsed light change oppositely to each other (complementary to each other) and thus, the phase modulation $\phi_{XPM}$ and the phase modulation $\phi_{SPM}$ bear signs opposite to each other (any phase offset that does not contribute to a broadening of the wavelength spectrum is not considered). In addition, the length of the first optical fiber 411 is set so that the absolute value of the phase modulation $\phi_{XPM}$ and the absolute value of the phase modulation $\phi_{SPM}$ are substantially equal to each other. As a result, the phase modulation $\phi_{XPM}$ and the phase modulation $\phi_{SPM}$ diminish each other and thus, an extremely small extent of broadening occurs in the wavelength spectrum of amplified main pulsed light due to the phase modulation. Namely, the main pulsed light can be amplified while suppressing broadening of the wavelength spectrum.

It is preferred that the first optical fiber 411 and the third optical fiber 413 each be a polarization-holding single mode fiber, the primary constituent of which is silica glass. In addition, it is preferred that the second optical fiber 412 and the fourth optical fiber 414 each be a YDFA (ytterbium doped fiber amplifier).

The second optical fiber 412 in the pulsed light generation device 400 may be constituted with optical fibers disposed over a plurality of stages. In other words, the main pulsed light may be amplified via optical fibers disposed over a plurality of stages, instead of at a single second optical fiber 412.

As described above, with the pulsed light generation device according to this embodiment, main pulsed light and sub pulsed light, with their waveforms different from each other, can be generated from light provided from a single laser light source.

Fifth Embodiment

Figure 17:
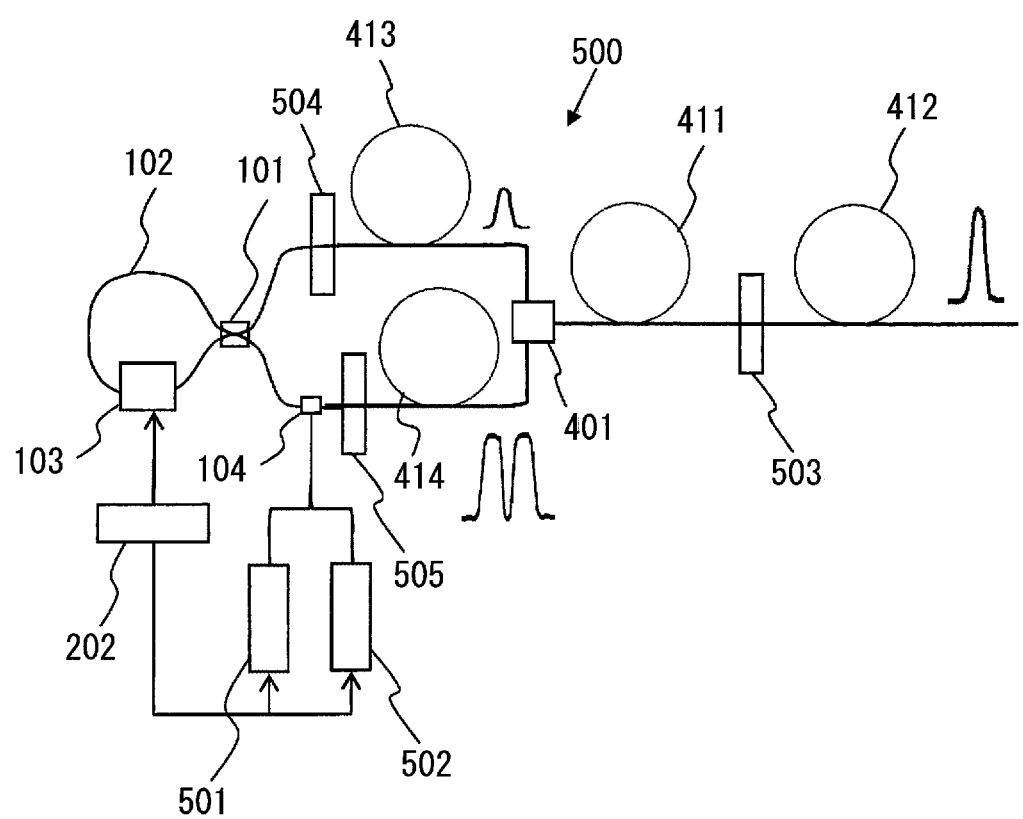
FIG. 17 is a conceptual diagram illustrating the pulsed light generation device according to the fifth embodiment.

FIG. 17 is a conceptual diagram illustrating a pulsed light generation device 500 according to the fifth embodiment of the present invention. The pulsed light generation device 500 is distinguishable from the pulsed light generation device 400 in that it includes a first laser light source 501 that outputs main pulsed light and a second laser light source 502 that outputs sub pulsed light. The pulsed light output from one of the laser light sources has a wavelength different from the wavelength of the pulsed light output from the other laser light source. In other words, the main pulsed light and the sub pulsed light have wavelengths different from each other. DFB lasers are preferably used for light sources to constitute the first laser light source 501 and the second laser light source 502. The pulsed light generation device 500 includes a bandpass filter 503 via which the main pulsed light and the sub pulsed light are separated from each other. In addition, the pulsed light generation device 500 does not require a polarizer element 401. It is to be noted that in FIG. 17, the same reference signs are assigned to structural elements similar to those in the pulsed light generation device 400.

The first laser light source 501 outputs pulsed light with a wavelength of 1064 nm, whereas the second laser light source 502 outputs pulsed light with a wavelength of 1058 nm. The pulsed light output from the first laser light source 501 and the pulsed light output from the second laser light source 502 both achieve a peak intensity of approximately 10 mW. The pulsed light output from the first laser light source 501 and the pulsed light output from the second laser light source 502 are multiplexed and then are input, via the input unit 104, to the first port 1. As a result, main pulsed light is formed at the second port 2 of the optical coupler 101, whereas sub pulsed light is generated at the first port 1 of the optical coupler 101. A bandpass filter 504, which allows only light with wavelength of 1064 nm to be transmitted, is disposed between the second port 2 and the third optical fiber 413, whereas a bandpass filter 505 which allows only light with wavelength of 1058 nm to be transmitted is disposed between the first port 1 and the fourth optical fiber 414.

While main pulsed light with wavelength of 1064 nm and main pulsed light with wavelength of 1058 nm are generated at the second port 2, the main pulsed light with wavelength of 1064 nm alone is transmitted through the bandpass filter 504, is propagated through the third optical fiber 413 and enters the multiplexer element 401. While sub pulsed light with wavelength of 1064 nm and sub pulsed light with wavelength of 1058 nm are generated at the first port 1, the sub pulsed light with wavelength of 1058 nm alone is transmitted through the bandpass filter 505, is propagated through the fourth optical fiber 414 and enters the multiplexer element 401. The third optical fiber 413 is disposed for purposes of optical path length adjustment so as to synchronize the main pulsed light and the sub pulsed light at the multiplexer element 401. Synchronization of the main pulsed light and the sub pulsed light has already been explained.

The main pulsed light and the sub pulsed light having been input to the multiplexer element 401 are multiplexed by the multiplexer element 401 and are then propagated through the first optical fiber 411. Namely, the main pulsed light and the amplified sub pulsed light are propagated through the first optical fiber 411. While they are propagated through the first optical fiber 411, phase modulation $\phi_{XPM}$ attributable to XPM under the influence of the sub pulsed light, occurs in the main pulsed light. The multiplexed light, constituted with the main pulsed light and the sub pulsed light, output from the first optical fiber 411 is input to the bandpass filter 503 and is separated to main pulsed light and sub pulsed light. The main pulsed light is propagated through the second optical fiber 412 and is amplified to achieve desired peak intensity. While the main pulsed light is propagated through the second optical fiber 412, phase modulation $\phi_{SPM}$ attributable to SPM occurs in the main pulsed light.

The sub pulsed light is amplified at the fourth optical fiber 414 so that the peak intensity of the main pulsed light is approximately 1/1000 of the peak intensity of the sub pulsed light at the time point at which the main pulsed light and the sub pulsed light are input to the first optical fiber 411. In addition, the length of the first optical fiber 411 is set so that the absolute value of the phase modulation $\phi_{XPM}$ and the absolute value of the phase modulation $\phi_{SPM}$ are substantially equal to each other. According to the pulsed light generation device 500, the main pulsed light can be amplified while suppressing any broadening of the wavelength spectrum.

It is preferred that the first optical fiber 411 and the third optical fiber 413 each be a polarization-maintaining single mode fiber, the primary constituent of which is silica glass, as those in the pulsed light generation device 400. In addition, it is preferred that the second optical fiber 412 and the fourth optical fiber 414 each be a polarization-maintaining YDFA, as those in the pulse light generation device 400. It is to be noted that if the second laser light source 502 provides a large output, e.g., if the second laser light source 502 outputs pulsed light with a peak intensity as high as several tens of watts, the fourth optical fiber 414 does not need to be included in the pulse light generation device.

As described above, with the pulsed light generation device according to the present embodiment, main pulsed light and sub pulsed light, having waveforms different from each other, can be generated. In the present embodiment, two laser light sources with their wavelengths different from each other are used to output pulsed light to be used to generate main pulsed light and sub pulsed light. Thus, the main pulsed light and the sub pulsed light can be reliably separated from each other via a wavelength-selection optical system assuming a simple structure.

Sixth Embodiment

Figure 18:
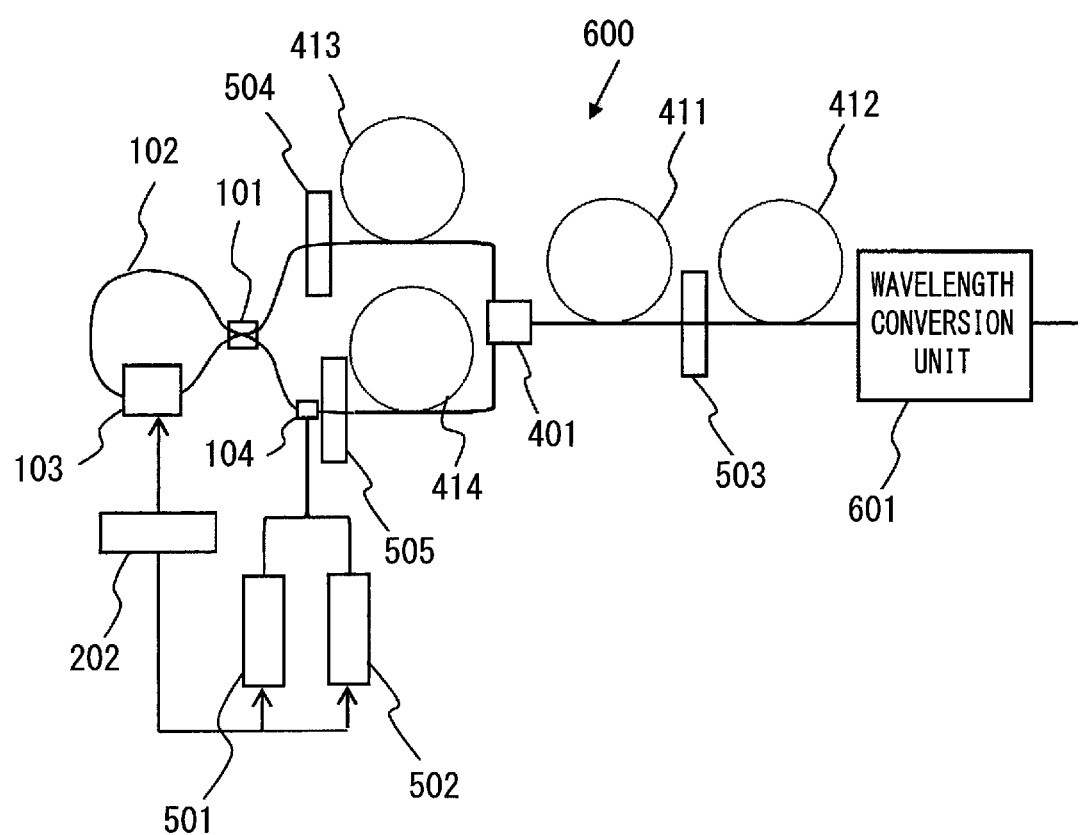
FIG. 18 is a conceptual diagram illustrating the pulsed light generation device according to the sixth embodiment.

FIG. 18 is a conceptual diagram illustrating a pulsed light generation device 600 according to the sixth embodiment of the present invention. In the pulsed light generation device 600, the wavelength of the amplified main pulsed light output from the second optical fiber 412 is converted to a shorter wavelength. The pulsed light generation device 600 is configured so as to include a wavelength conversion unit 601, in addition to the structural components in the pulsed light generation device 500. The main pulsed light, having been propagated and amplified through the second optical fiber 412 is input to the wavelength conversion unit 601. The wavelength conversion unit 601, which includes a plurality of nonlinear optical crystals, converts the wavelength of the main pulsed light to a wavelength in the ultraviolet range and outputs the pulsed light with the ultraviolet wavelength range. Namely, the pulsed light generation device 600 outputs ultraviolet pulsed light.

Figure 19:
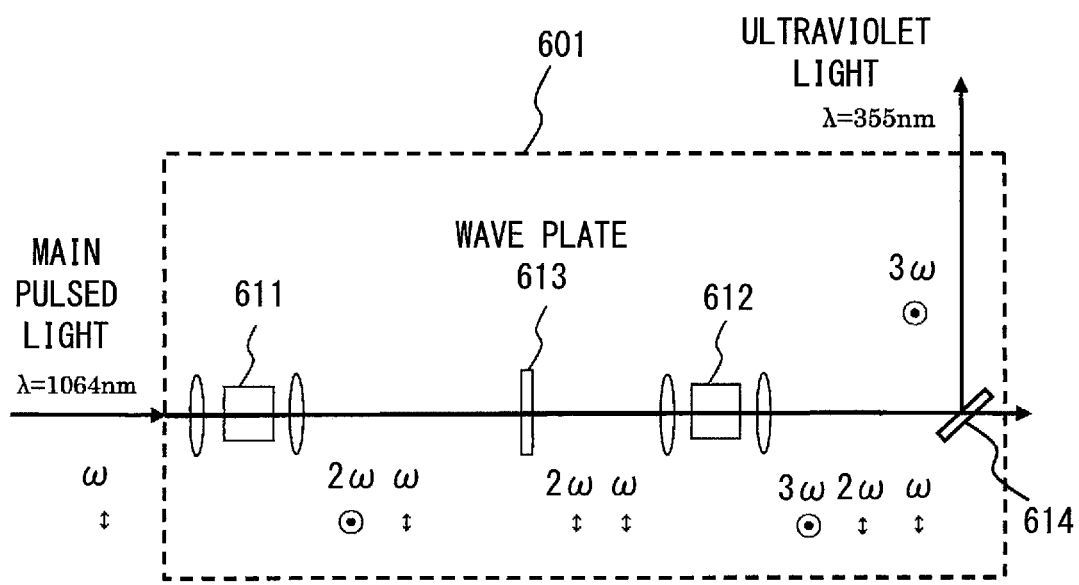
FIG. 19 is a schematic diagram illustrating an example of a structure of the wavelength conversion unit

FIG. 19 is a schematic diagram presenting a structure that may be adopted for the wavelength conversion unit 601. In FIG. 19, an arrow pointing up/down represents linearly polarized light whose polarization direction is parallel to the drawing sheet (P polarized light), and a double circle mark indicates a polarization direction whose polarization direction is perpendicular to the drawing sheet (S polarized light). Each vertically elongated ellipsoid represents a lens, and ω represents the frequency of the main pulsed light. The main pulsed light with wavelength of 1064 nm output from the second optical fiber 412 is input to the wavelength conversion unit 601. The main pulsed light being input to the wavelength conversion unit 601 is P polarized light.

The P polarized main pulsed light (hereafter may be referred to as a fundamental wave), having been input to the wavelength conversion unit 601, enters a nonlinear optical crystal 611 and is propagated through the nonlinear optical crystal 611. As a result, second harmonic (S polarized light with a frequency 2ω) of the fundamental wave is generated. The nonlinear optical crystal 611 may be, for instance, an LBO crystal. The S polarized second harmonic, having been generated at the nonlinear optical crystal 611, and the P polarized fundamental wave, having been transmitted through the nonlinear optical crystal 611, are input to a wave plate 613. At the wave plate 613, the polarization direction of the second harmonic is altered by 90° and thus, the S polarized second harmonic is converted to P polarized second harmonic. The P polarized second harmonic and the P polarized fundamental wave are input to a nonlinear optical crystal 612 and are propagated therethrough. At the nonlinear optical crystal 612, S polarized third harmonic (with a frequency 3ω) is generated through sum-frequency generation. The nonlinear optical crystal 612 may be an LBO crystal.

The S polarized third harmonic, having been generated at the nonlinear optical crystal 612, enters a dichroic mirror 614 together with the P polarized second harmonic and the P polarized fundamental wave having been transmitted through the nonlinear optical crystal 612. At the dichroic mirror 614, the S polarized third harmonic alone is reflected while the P polarized second harmonic and the P polarized fundamental wave are transmitted through. As a result, the S polarized third harmonic is separated. The wavelength of the third harmonic is 355 nm and thus falls into the ultraviolet range.

While the main pulsed light input to the wavelength conversion unit 601 is P polarized light in above description, S polarized main pulsed light may instead enter the wavelength conversion unit 601 and, in such a case, too, main pulsed light in the ultraviolet range can be obtained through the configuration illustrated in FIG. 19.

It is to be noted that while the configuration according to the sixth embodiment includes the wavelength conversion unit 601 added to the pulsed light generation device 500, a configuration that includes the wavelength conversion unit 601 added to the pulsed light generation device 400 may be adopted, instead.

In the embodiments described above, pulsed light is input through the input unit 104 to the first port 1, main pulsed light is generated at the second port 2 and sub pulsed light is generated at the first port 1. However, as has been explained in reference to the variation of the first embodiment, it is obvious that if main pulsed light is to be generated at the first port 1 and sub pulsed light is to be generated at the second port 2 with pulsed light input through the input unit 104 to the first port 1, the structural feature pertaining to the main pulsed light and the structural feature pertaining to the sub pulsed light must be switched in the pulse modulator. For instance, the third optical fiber 413 will need to be disposed on the side where the first port 1 is located and the fourth optical fiber 414 will need to be disposed on the side where the second port 2 is located in the pulsed light generation devices 400, 500 and 600, illustrated in FIGS. 16, 17 and 18.

The pulsed light generation device according to the embodiment makes it possible to amplify the main pulsed light so as to assure high intensity while suppressing any broadening of the wavelength spectrum and furthermore, to convert the wavelength of the main pulsed light to a wavelength in the ultraviolet range. Such a pulsed light generation device will be preferably used in applications as a light source for an exposure apparatus, an inspection apparatus or the like constituted with a high-density integrated circuit.

Figure 20:
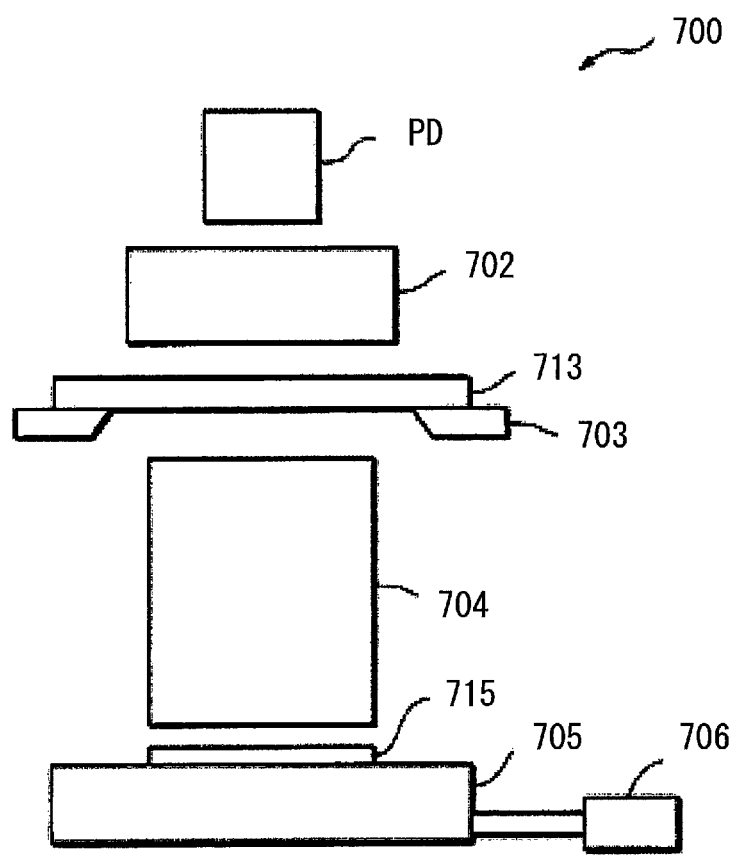
FIG. 20 is a diagram schematically illustrating the structure of an exposure apparatus as a first application example of a system having the pulsed light generation device.

An exposure apparatus used in a photolithography process in manufacturing of semiconductor or liquid crystal panel, as a first application example of a system equipped with the pulsed light generation device described above, will now be explained in reference to FIG. 20 schematically illustrating its structure. In an exposure apparatus 700, a fine pattern drawn on a photomask 713 constituted of silica glass, which functions as a pattern forming unit, is transferred by optically projecting the pattern onto an exposure target 715, such as a semiconductor wafer or a glass substrate having a photo resist applied thereto, through a process that is, in principle, similar to a photo engraving process.

The exposure apparatus 700 is configured to include the above-described pulsed light generation device PD (e.g., the pulsed light generation device 600), an illumination optical system 702, a mask support stage 703 which holds the photomask 713, a projection optical system 704, an exposure target support table 705 which holds the exposure target 715, and a drive mechanism 706 which moves the exposure target support table 705 in a horizontal plane. The illumination optical system 702 includes a plurality of lens groups and irradiates an ultraviolet pulsed light output from the pulsed light generation device PD onto the photomask 713 which is held on the mask support stage 703. The projection optical system 704 includes a plurality of lens groups and project the light transmitting through the photomask 713 onto the exposure target object 715 held on the exposure target support table 705.

In the exposure apparatus 700, the ultraviolet pulsed light output from the pulsed light generation device PD is input to the illumination optical system 702 and adjusted to have a predetermined ultraviolet pulsed light flux. The ultraviolet pulsed light flux is then irradiated onto the photomask 713 which is held at the mask support stage 703. An image of the pattern drawn on the photomask 713 is formed at a predetermined position of the exposure target 715 which is held on the exposure target support table 705 via the projection optical system 704. Through this process, an image of the pattern on the photomask 713 is exposed onto the exposure target 715, such as a semiconductor wafer or a glass substrate for a liquid crystal panel, at a predetermined magnification factor.

While the exposure apparatus 700 is equipped with the pulsed light generation device PD of a relatively simple structure, capable of providing a high output and outputting ultraviolet pulsed light with a high-quality beam. Thus, it may be expected to contribute to an improvement of the throughput in the photolithography process and to an improvement in the processing quality.

Figure 21:
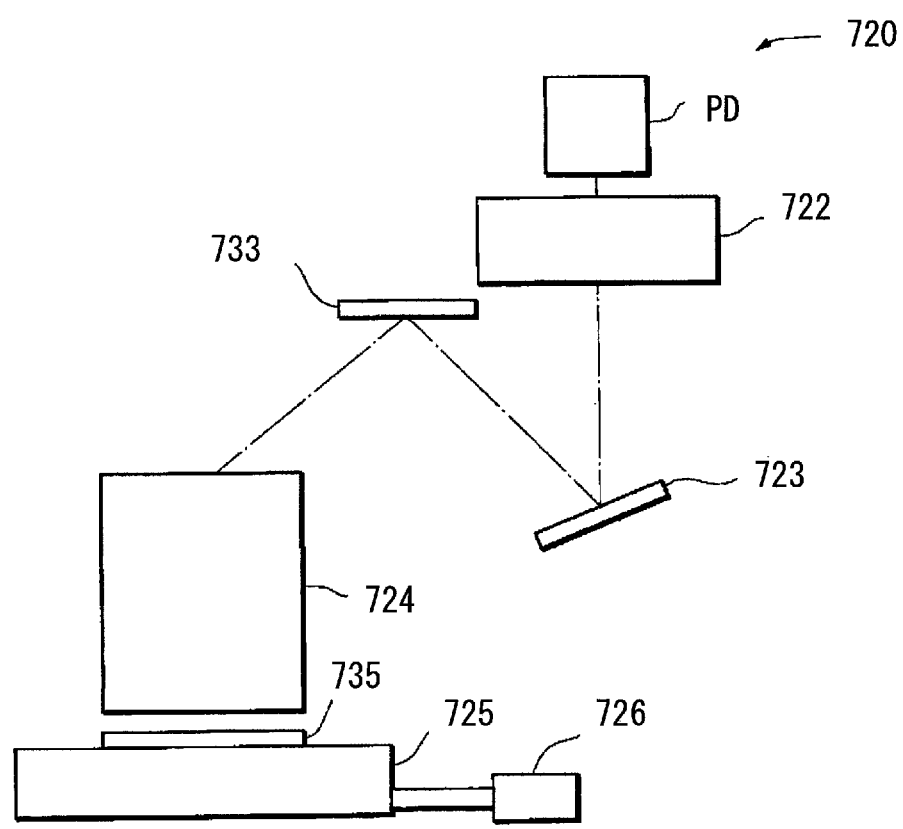
FIG. 21 is a diagram schematically illustrating the structure of an exposure apparatus as a second application example of a system having the pulsed light generation device.

An exposure apparatus that includes a variable pattern forming mask to function as a pattern forming unit, as a second application example of a system equipped with the pulsed light generation device described above will be explained next in reference to FIG. 21, schematically illustrating its structure. An exposure apparatus 720 is basically similar to the exposure apparatus 700 in the first application example explained above, except that it includes a variable pattern forming mask instead of the photomask. In the exposure apparatus 720, an image of an arbitrary pattern, generated by the variable pattern forming mask, is transferred by optically projecting onto an exposure target 715, such as a glass substrate or a semiconductor wafer with a photoresist applied thereto (see, for instance, Japanese Patent Publication No. 5211487, Japanese Laid Open Patent Publication No. 2012-54500, Japanese Laid Open Patent Publication No. 2011-49296, all submitted by the applicant of the present invention).

The exposure apparatus 720 comprises a pulsed light generation device PD described above (e.g., the pulsed light generation device 600), an illumination optical system 722, a variable pattern forming mask 733, a projection optical system 724, an exposure target support table 725 at which the exposure target 735 is held, and a drive mechanism 726 that drives the exposure target support table 725 in a horizontal plane. Via the illumination optical system 722 constituted with a plurality of lens groups, the variable pattern forming mask 733 via a mirror 723 is irradiated with ultraviolet pulsed light output from the pulsed light generation device PD. Via the projection optical system 724 constituted with a plurality of lens groups, light carrying arbitrary pattern formed by the variable pattern forming mask 733 is projected onto the exposure target 735 held on the exposure target support table 725.

The variable pattern forming mask 733 is structured with a plurality of movable mirrors so as to generate light in a arbitrary pattern. A DMD (digital micromirror device or deformable micromirror device), configured by disposing a plurality of movable mirrors in a two-dimensional pattern, is an preferable example of such a variable pattern forming mask 733. Each of the movable mirrors are disposed so that their reflecting surfaces can be adjusted to turn along desired directions independently, and each movable mirror is switched between an ON position and an OFF position by a DMD drive device (not shown). As an alternative, the pattern forming unit may be a micromirror device that switches the reflected light between an ON state and an OFF state simply by creating a phase shift in reflected light without altering the orientation of the reflecting surface of each movable mirror.

Upon the DMD drive device controls the position of a movable mirrors so that they take the ON position, light having exited the illumination optical system 722 is reflected by the movable mirrors, enters the projection optical system 724 and forms an image on the exposure surface of the exposure target 735. On the other hand, upon the DMD drive device controls the position of a movable mirrors so that it takes an OFF position, light having exited the illumination optical system 722 is reflected at the movable mirrors but does not enter the projection optical system 724 and instead, it is absorbed into a damper disposed on the optical path of the reflected light. Accordingly, exposure can be executed with light in arbitrary pattern, by controlling movable mirrors disposed at predetermined positions so that they are set in the ON position and controlling other movable mirrors so that they are set in the OFF position.

In the exposure apparatus 720, the ultraviolet pulsed light output from the pulsed light generation device PD enters the illumination optical system 722 and it is adjusted into a predetermined light flux and the variable pattern forming mask 733 is irradiated with the ultraviolet pulsed light via the mirrors 723. The ultraviolet pulsed light formed in a predetermined pattern by the variable pattern forming mask 733 enters the projection optical system 724 and then a predetermined position of the exposure target 735 held at the exposure target support table 725 is irradiated with the ultraviolet pulsed light. Through this process, an image is formed with exposure light corresponding to the exposure pattern on the exposure target 735 such as a semiconductor wafer or a liquid crystal panel at a predetermined magnification factor.

As explained above, the pulsed light generation device PD is capable of high speed ON/OFF control of ultraviolet pulsed light. This means that the ultraviolet pulsed light, which is a particularly crucial factor in an exposure apparatus including a variable pattern forming mask, can be controlled with high accuracy. This makes it possible to achieve highly accurate exposure.

Figure 22:
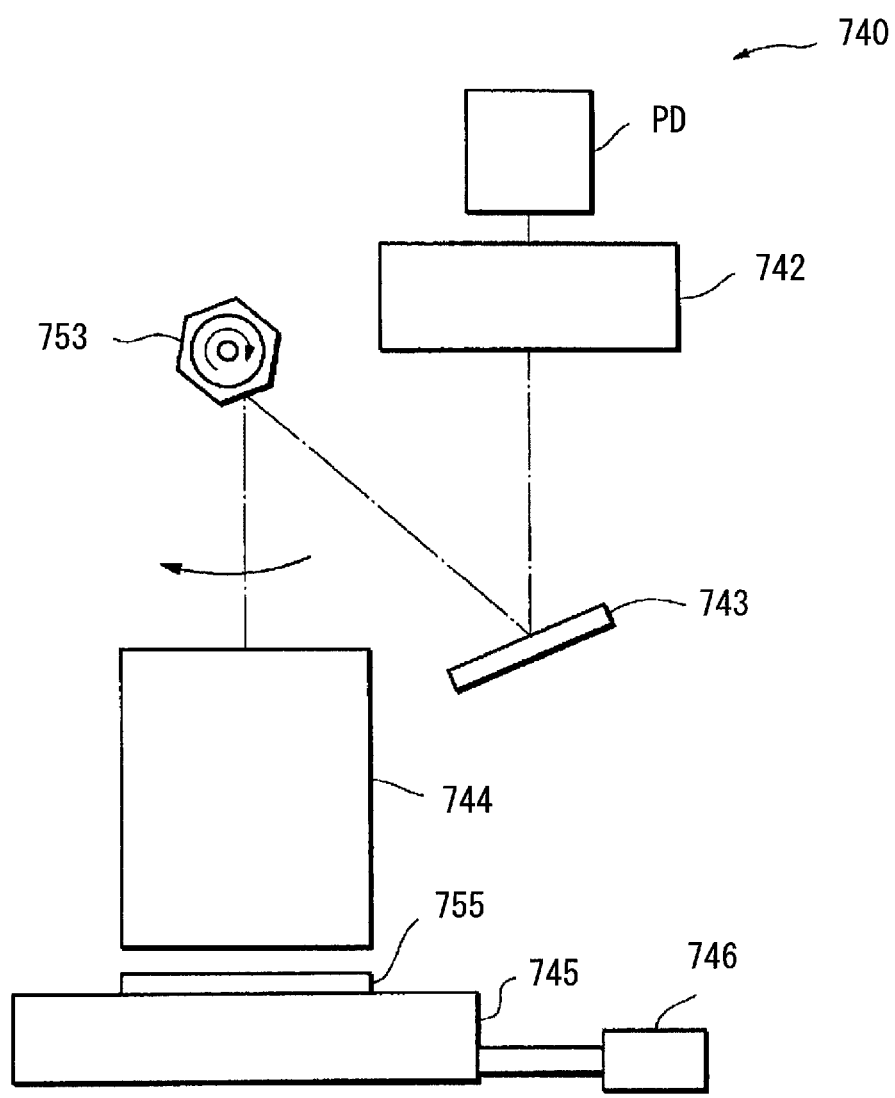
FIG. 22 is a diagram schematically illustrating the structure of an exposure apparatus as a third application example of a system having the pulsed light generation device.

An exposure apparatus that adopts a direct drawing system as a third application example of a system equipped with the pulsed light generation device described above will be explained next in reference to FIG. 22. A pattern forming unit of this exposure apparatus 740 directly draws an image of arbitrary pattern set in advance by deflecting ultraviolet pulsed light output from the pulsed light generation device PD so that ultraviolet pulsed light scans on the exposure target 755. The deflecting means used in this application example is a polygon mirror.

The exposure apparatus 740 comprises a pulsed light generation device PD described above (e.g., the pulsed light generation device 600) a shaping optical system 742, a polygon mirror 753, an objective optical system 744, an exposure target support table 745 at which the exposure target 755 is held and a drive mechanism 746 that drives the exposure target object support table 745 in a horizontal plane. The shaping optical system 742, constituted with a plurality of lens groups including a collimating lens, shapes ultraviolet pulsed light output from the pulsed light generation device PD and allows the shaped ultraviolet pulsed light to enter, via a mirror 743, the polygon mirror 753. The polygon mirror 753 is a rotary polygon mirror. In the example presented in FIG. 22, a polygon mirror taking an equilateral hexagonal shape in a plan view, is rotatably driven around an axis extending perpendicular to the sheet by a mirror drive mechanism. Via the objective optical system 744, constituted with a plurality of lens groups such as an fθ lens and a condenser lens, an image is formed on the exposure target 755 held on the exposure target table 745 with the ultraviolet pulsed light scanning the exposure target 755 by the polygon mirror 753. The exposure target 755 is moved by the exposure target table 745 along a direction perpendicular to the scanning direction along which the exposure target 755 is scanned with the ultraviolet pulsed light from the polygon mirror 753 (i.e., the exposure target 755 is moved along a direction perpendicular to the sheet).

The operations of the pulsed light generation device PD, the polygon mirror 753 and the exposure target table 745 are controlled by a control device (not shown). Data indicating a pattern to be drawn on the exposure target 755 are stored in the control device in advance and the control device controls the operations of the pulsed light generation device PD, the polygon mirror 753 and the exposure target table 745 in correspondence to the pattern data stored therein. Through this process, an image of a preset pattern is formed through exposure on the exposure target 755 held at the exposure target table 745.

As explained above, the pulsed light generation device PD enables high-speed ON/OFF control of ultraviolet pulsed light. This means that the ultraviolet pulsed light itself, which is a particularly critical factor in an exposure apparatus that directly draws a pattern with ultraviolent pulsed light without employing a mask, as in this application example, can be controlled with high accuracy, and highly accurate exposure can be ultimately achieved.

It is to be noted that while the polygon mirror 753 is used as the deflecting means in this application example, a deflecting means adopting another structure may be used, instead. For instance, a galvanometer mirror may be used instead of the polygon mirror 753. As a further alternative, two galvanometer mirrors may be combined so as to be set along two directions perpendicular to each other and ultraviolet pulsed light output from the pulsed light generation device PD may be directed to scan the exposure target 755 along the two directions.

Figure 23:
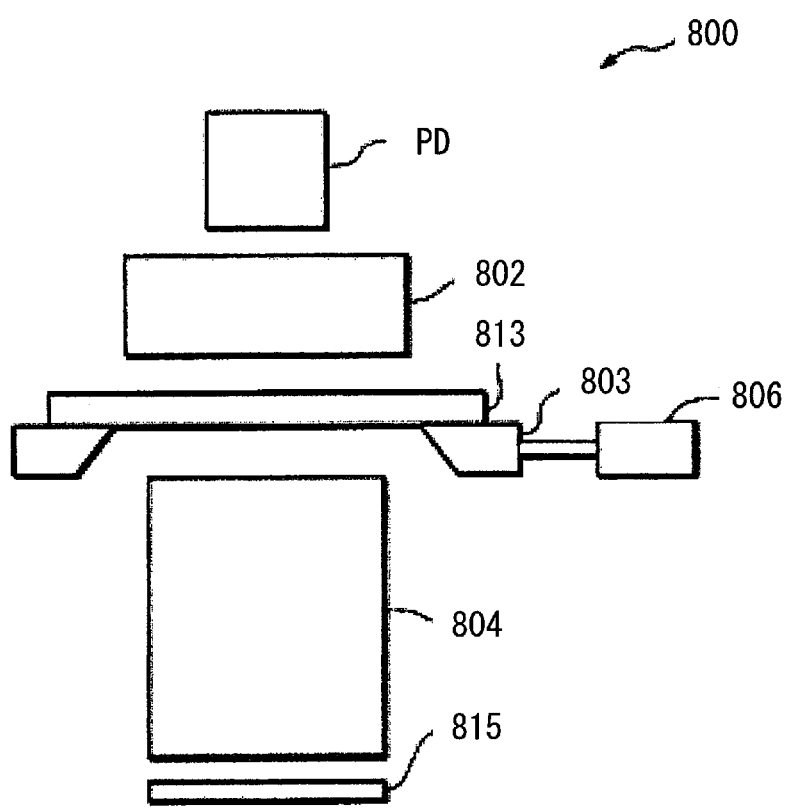
FIG. 23 is a diagram schematically illustrating the structure of an inspection apparatus as a fourth application example of a system having the pulsed light generation device.

An inspection apparatus used in an inspection process through which an inspection target, such as photomask, a liquid crystal panel or a wafer or the like, is inspected, as a fourth application example of a system equipped with the pulsed light generation device PD, will be described next in reference to FIG. 23 schematically illustrating its structure. An inspection apparatus 800 is preferably used to inspect a very fine pattern drawn on an inspection target 813 having optical transparency, such as a photomask.

The inspection apparatus 800 is configured to include the pulsed light generation device PD described above, an illumination optical system 802, an inspection target support stage 803 at which the inspection target 813 is held, a projection optical system 804, a TDI (time delay integration) sensor 815 that detects light from the inspection target 813, and a drive mechanism 806 that moves the inspection target support stage 803 in a horizontal plane. The illumination optical system 802 includes a plurality of lens groups. The illumination optical system 802 adjusts the ultraviolet pulsed light output from the pulsed light generation device PD to have a predetermined light flux, and then irradiates the ultraviolet pulsed light flux onto the inspection target 813 which is held by the inspection target support stage 803. The projection optical system 804 includes a plurality of lens groups and project the light transmitting through the inspection target 813 onto the TDI sensor 815.

In the inspection apparatus 800, the ultraviolet pulsed light output from the pulsed light generation device PD is input to the illumination optical system 802 and adjusted to have a predetermined light flux, and the ultraviolet pulsed light is irradiated onto the inspection target 813 such as a photomask which is held at the inspection target support stage 803. The light from the inspection target 813 (a transmitted light in this application example) has an image of a pattern drawn on the inspection target 813, and the light is projected via the projection optical system 804 onto the TDI sensor 815 to form an image. During this period, a horizontal velocity of the inspection target support stage 803 moved by the drive mechanism 806 and a transfer clock at the TDI sensor 815 are synchronously controlled.

Thus, the image of the pattern on the inspection target 813 is detected by the TDI sensor 815. A comparison between the image of the inspection target 813 detected in this way and a predetermined reference image, which is preset, extracts any defects in the pattern drawn on the inspection target. If the inspection target 813 such as a wafer has no optical transparency, the same configuration can be achieved by guiding a reflected light from the inspection target so that the light is incident upon the projection optical system 804 and then propagates to the TDI sensor 815.

Because the inspection apparatus 800 is configured to include the pulsed light generation device PD capable of providing a ultraviolet pulsed light with high output and high-quality beam and thus, it can be expected to contribute to an improvement in inspection accuracy during the inspection process and to a reduction in the length of time required for the inspection process.

It is to be noted that the present invention is not limited to the particulars of the embodiments described above and any other mode conceivable within the scope of the technical teaching of the present invention is within the scope of the present invention. In addition, any combination of the embodiments described above is also within the scope of the present invention.

What is claimed is:

1. A pulsed light generation device, comprising:
an optical coupler having at least four input/output ports including a first port, a second port, a third port and a fourth port;
a connection optical path that connects the third port with the fourth port in a loop; and
a phase modulation element disposed in the connection optical path, wherein:
the optical coupler branches input pulsed light input to the first port and outputs the branched input pulsed light as first-direction pulsed light and second-direction pulsed light respectively to the third port and to the fourth port; and
the phase modulation element applies phase modulation to at least either one of the first-direction pulsed light and the second-direction pulsed light, thereby outputs output pulsed lights through the first port and through the second port, wherein:

a waveform of one of the output pulsed lights output through the first port is different from a waveform of the other of the output pulsed lights output through the second port.

2. The pulsed light generation device according to claim 1, wherein:
the phase modulation element applies phase modulations different from each other to the first-direction pulsed light and the second-direction pulsed light.

3. The pulsed light generation device according to claim 1, wherein:
an optical distance from the phase modulation element to the third port and an optical distance from the phase modulation element to the fourth port are different from each other.

4. A pulsed light generation device, comprising:
an optical coupler having at least four input/output ports including a first port, a second port, a third port and a fourth port;
a connection optical path that connects the third port with the fourth port; and
a phase modulation element disposed in the connection optical path, wherein:
the optical coupler branches input pulsed light input to the first port and outputs the branched input pulsed light as first-direction pulsed light and second-direction pulsed light respectively to the third port and to the fourth port; and
the phase modulation element applies phase modulation to at least either one of the first-direction pulsed light and the second-direction pulsed light, thereby outputs output pulsed lights through the first port and through the second port, wherein a waveform of one of the output pulsed lights output through the first port is different from a waveform of the other of the output pulsed lights output through the second port, wherein:
in the optical coupler, light can be propagated between the first port and the third port, between the first port and the fourth port, between the second port and the third port and between the second port and the fourth port;
a phase of the light propagated between the first port and the fourth port is delayed by ¼ of wavelength relative to the phase of the light propagated between the first port and the third port; and
the phase of the light propagated between the second port and the third port is delayed by ¼ of wavelength relative to the phase of the light propagated between the second port and the fourth port.

5. The pulsed light generation device according to claim 1, wherein:
the phase modulation element executes phase modulation on a portion of a pulse in at least either of the first-direction pulsed light and the second-direction pulsed light by an extent equivalent to ½ of wavelength.

6. The pulsed light generation device according to claim 1, wherein:
among the output pulsed lights, an intensity of first pulsed light output from either one of the first port or the second port increases while an intensity of second pulsed light output from the other port decreases, and the intensity of the first pulsed light decreases while the intensity of the second pulsed light increases.

7. The pulsed light generation device according to claim 6, wherein:
the second pulsed light achieves a maximum value at time points preceding and following a time point at which the intensity of the first pulsed light peaks.

8. The pulsed light generation device according to claim 1, wherein:
the phase modulation element disposed in the connection optical path is a first phase modulation element;
the pulsed light generation device further comprises a second phase modulation element disposed at a position different from a position at which the first phase modulation element is disposed, wherein
an optical distance from the second phase modulation element to the third port and an optical distance from the second phase modulation element to the fourth port are different from each other.

9. The pulsed light generation device according to claim 8, wherein:
the first phase modulation element executes phase modulation on a portion of a pulse in the first-direction pulsed light by an extent equivalent to ¼ of wavelength; and
the second phase modulation element executes phase modulation on a portion of a pulse in the second direction pulsed light by an extent equivalent to ¼ of wavelength along a direction opposite to a direction of the phase modulation executed on the first-direction pulsed light.

10. The pulsed light generation device according to claim 1, further comprising:
a multiplexer element that generates multiplexed light by multiplexing the output pulsed lights input thereto;
a first optical fiber through which the multiplexed light output from the multiplexer element and input thereto is propagated;
a separation element that separates the multiplexed light; and
a second optical fiber at which pulsed light output from the separation element and input thereto is amplified as the pulsed light is propagated therein.

11. The pulsed light generation device according to claim 10, further comprising:
a first laser light source that outputs pulsed light for inputting with a first wavelength; and
a control unit that controls the first laser light source and the phase modulation element.

12. The pulsed light generation device according to claim 10, wherein:
the separation element is a polarization beam splitter.

13. The pulsed light generation device according to claim 11, further comprising:
a second laser light source that outputs pulsed light for inputting with a second wavelength different from the first wavelength, wherein:
the control unit controls the second laser light source; and
the separation element is a wavelength selection filter.

14. The pulsed light generation device according to claim 10, further comprising:
a third optical fiber disposed between the second port and the multiplexer element; and
a fourth optical fiber disposed between the first port and the multiplexer element.

15. The pulsed light generation device according to claim 10, further comprising:
a wavelength conversion unit that converts a wavelength of the pulsed light input thereto after having been output from the second optical fiber and propagated therein.

16. The pulsed light generation device according to claim 15, wherein:

the wavelength conversion unit includes a plurality of nonlinear optical crystals and converts the wavelength of the pulsed light to a wavelength in the ultraviolet range.

17. A pulsed light generation method, comprising steps of:
inputting pulsed light for inputting to a first port of an optical coupler having at least four input/output ports including the first port, a second port, a third port and a fourth port, and branching the pulsed light for inputting;
outputting first-direction pulsed light and second-direction pulsed light respectively through the third port and the fourth port, to a connection optical path to which the third port and the fourth port are connected in a loop;
applying phase modulation to at least either one of the first-direction pulsed light and the second-direction pulsed light in the connection optical path; and
outputting output pulsed lights through the first port and through the second port, wherein:
a waveform of the either of the output pulsed lights through the first port is different from a waveform of the other of the output pulsed lights output through the second port.

18. The pulsed light generation method according to claim 17, wherein:
phase modulations different from each other are applied to the first-direction pulsed light and the second-direction pulsed light.

19. The pulsed light generation method according to claim 17, wherein:
in the optical coupler, light can be propagated between the first port and the third port, between the first port and the fourth port, between the second port and the third port and between the second port and the fourth port;
a phase of the light propagated between the first port and the fourth port is delayed by ¼ of wavelength relative to the phase of the light propagated between the first port and the third port; and
the phase of the light propagated between the second port and the third port is delayed by ¼ of wavelength relative to the phase of the light propagated between the second port and the fourth port.

20. The pulsed light generation method according to claim 17, wherein:
phase modulation is executed on a portion of a pulse in at least either the first-direction pulsed light or the second-direction pulsed light by an extent equivalent to ½ of wavelength.

21. The pulsed light generation method according to claim 17, wherein:
phase modulation is executed on a portion of a pulse in the first-direction pulsed light by an extent equivalent to ¼ of wavelength; and
phase modulation is executed on a portion of a pulse in the second-direction pulsed light by an extent equivalent to ¼ of wavelength along a direction opposite to a direction in which the phase modulation is executed on the first-direction pulsed light.

22. The pulsed light generation method according to claim 17, wherein:
among the output pulsed lights, an intensity of one of the output pulsed lights output as first pulsed light increases while an intensity of the other of the output pulsed lights output as second pulsed light decreases and the intensity of the first pulsed light decreases while the intensity of the second pulsed light increases.

23. The pulsed light generation method according to claim 22, wherein:
the second pulsed light achieves a maximum value at time points preceding and following a time point at which the intensity of the first pulsed light peaks.

24. The pulsed light generation method according to claim 22, wherein:
multiplexed light generated by multiplexing the output pulsed lights is input to a first optical fiber and is propagated therein;
the multiplexed light output from the first optical fiber is separated into the first pulsed light and the second pulsed light, and the first pulsed light is input to a second optical fiber and is amplified as the first pulsed light is propagated therein; and
phase modulation occurring in the first pulsed light in the second optical fiber due to self-phase modulation is diminished by cross-phase modulation occurring in the first pulsed light under influence of the second pulsed light in the first optical fiber.

25. The pulsed light generation method according to claim 24, wherein:
the multiplexed light output from the first optical fiber is separated into the first pulsed light and the second pulsed light by a polarization beam splitter; and
the first pulsed light, having been separated, is input to the second optical fiber and is propagated therein.

26. The pulsed light generation method according to claim 24, wherein:
the input pulsed light is pulsed light generated by multiplexing pulsed light with a first wavelength and pulsed light with a second wavelength;
the pulsed light with the first wavelength is separated from the pulsed light with the second wavelength by a wavelength selection filter; and
the first pulsed light, having been separated, is input to the second optical fiber and is propagated therein.

27. The pulsed light generation method according to claim 24, wherein:
the second pulsed light is amplified before the second pulsed light is multiplexed with the first pulsed light.

28. The pulsed light generation method according to claim 24, wherein:
a wavelength of the first pulsed light is converted by inputting the first pulsed light to a wavelength conversion unit and propagating the first pulsed light therethrough.

29. The pulsed light generation method according to claim 28, wherein:
the wavelength of the first pulsed light is converted to a wavelength in the ultraviolet range via a plurality of nonlinear optical crystals included in the wavelength conversion unit.

30. An exposure apparatus, comprising:
a pulsed light generation device according to claim 1;
an exposure target support unit that holds an exposure target;
a pattern forming unit that forms a predetermined pattern light with pulsed light output from the pulsed light generation device; and
a projection optical system that projects the pattern light onto the exposure target held by the exposure target support unit.

31. An inspection apparatus, comprising:
a pulsed light generation device according to claim 1;
an inspection target support unit that holds an inspection target;

an illumination optical system that irradiates pulsed light output from the pulsed light generation device onto the inspection target held by the inspection target holding unit; and
a projection optical system that projects light from the inspection target onto a detector.

\* \* \* \* \*